(12) United States Patent
Juengling

(10) Patent No.: US 9,190,494 B2
(45) Date of Patent: Nov. 17, 2015

(54) SYSTEMS AND DEVICES INCLUDING FIN FIELD-EFFECT TRANSISTORS EACH HAVING U-SHAPED SEMICONDUCTOR FIN

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 412 days.

(21) Appl. No.: 12/033,799

(22) Filed: Feb. 19, 2008

(65) Prior Publication Data

US 2009/0206400 A1    Aug. 20, 2009

(51) Int. Cl.

| | |
|---|---|
| H01L 29/76 | (2006.01) |
| H01L 29/66 | (2006.01) |
| H01L 21/8234 | (2006.01) |
| H01L 27/088 | (2006.01) |
| H01L 27/108 | (2006.01) |
| H01L 29/78 | (2006.01) |
| H01L 21/336 | (2006.01) |
| H01L 21/76 | (2006.01) |

(52) U.S. Cl.
CPC .. *H01L 29/66795* (2013.01); *H01L 21/823431* (2013.01); *H01L 27/0886* (2013.01); *H01L 27/10876* (2013.01); *H01L 27/10879* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 3,885,861 A | 5/1975 | Farnsworth et al. | |
| 5,160,987 A | 11/1992 | Pricer et al. | |
| 5,196,910 A | 3/1993 | Moriuchi et al. | |
| 5,661,061 A | 8/1997 | Usuami et al. | |
| 5,821,513 A | 10/1998 | O'Hagan et al. | |
| 5,858,829 A | 1/1999 | Chen | |
| 5,925,918 A | 7/1999 | Wu et al. | |
| 5,949,057 A | 9/1999 | Feng | |
| 6,008,513 A | 12/1999 | Chen | |
| 6,043,562 A | 3/2000 | Keeth | |
| 6,081,008 A | 6/2000 | Rostoker | |
| 6,100,129 A | 8/2000 | Tu et al. | |
| 6,130,551 A | 10/2000 | Agrawal et al. | |
| 6,216,257 B1 | 4/2001 | Agrawal et al. | |
| 6,258,656 B1 | 7/2001 | Lange et al. | |
| 6,258,659 B1 | 7/2001 | Gruening et al. | |
| 6,268,243 B1 | 7/2001 | Park | |
| 6,282,113 B1 | 8/2001 | DeBrosse | |
| 6,316,309 B1 | 11/2001 | Holmes et al. | |

(Continued)

FOREIGN PATENT DOCUMENTS

| | | |
|---|---|---|
| DE | 19946719 | 4/2001 |
| JP | 2006054431 | 2/2006 |

(Continued)

OTHER PUBLICATIONS

Oxford English Dictionary (Online), 2009, Oxford University Press <http://www.oed.com/>.*

(Continued)

*Primary Examiner* — Michael Jung
(74) *Attorney, Agent, or Firm* — Fletcher Yoder, P.C.

(57) ABSTRACT

Disclosed are methods, systems and devices, including a system, having a memory device. In some embodiments, the memory device includes a plurality of fin field-effect transistors disposed in rows, a plurality of insulating fins each disposed between the rows, and a plurality of memory elements each coupled to a terminal of a fin field-effect transistor among the plurality of fin field-effect transistors.

21 Claims, 22 Drawing Sheets

(56) References Cited

U.S. PATENT DOCUMENTS

| | | | |
|---|---|---|---|
| 6,380,759 B1 | 4/2002 | Agrawal et al. | |
| 6,432,769 B1 | 8/2002 | Fukuda et al. | |
| 6,440,792 B1 | 8/2002 | Shaio et al. | |
| 6,689,660 B1 | 2/2004 | Noble et al. | |
| 6,845,033 B2 | 1/2005 | Kirihata et al. | |
| 6,897,107 B2 | 5/2005 | Divakaruni et al. | |
| 6,927,462 B2 | 8/2005 | Goodwin et al. | |
| 6,967,147 B1 | 11/2005 | Tews et al. | |
| 6,998,666 B2 | 2/2006 | Beintner et al. | |
| 7,019,353 B2 | 3/2006 | Lindsay et al. | |
| 7,091,543 B2 | 8/2006 | Tzeng et al. | |
| 7,098,105 B2 | 8/2006 | Juengling | |
| 7,099,216 B2 | 8/2006 | Luk et al. | |
| 7,132,333 B2 | 11/2006 | Schloesser et al. | |
| 7,151,023 B1 | 12/2006 | Nayfeh et al. | |
| 7,190,060 B1 | 3/2007 | Chiang | |
| 7,195,995 B2 | 3/2007 | Mouli | |
| 7,205,606 B2 | 4/2007 | Tran | |
| 7,345,937 B2 | 3/2008 | Yoon et al. | |
| 7,442,976 B2 | 10/2008 | Juengling | |
| 2001/0003034 A1 | 6/2001 | Furukawa et al. | |
| 2002/0155656 A1 | 10/2002 | Hayano et al. | |
| 2003/0168676 A1 | 9/2003 | Itabashi et al. | |
| 2003/0198073 A1 | 10/2003 | Keeth | |
| 2004/0016953 A1 | 1/2004 | Lindsay et al. | |
| 2004/0027848 A1 | 2/2004 | Wald et al. | |
| 2004/0043592 A1 | 3/2004 | Goodwin et al. | |
| 2004/0062069 A1 | 4/2004 | Keeth | |
| 2004/0106267 A1* | 6/2004 | Beyer et al. | 438/437 |
| 2004/0125636 A1 | 7/2004 | Kurjanowicz et al. | |
| 2004/0202027 A1 | 10/2004 | Kuzmenka et al. | |
| 2005/0133852 A1 | 6/2005 | Shau | |
| 2005/0136617 A1* | 6/2005 | Jang | 438/427 |
| 2005/0151206 A1 | 7/2005 | von Schwerin | |
| 2005/0196918 A1 | 9/2005 | von Schwerin | |
| 2005/0245024 A1 | 11/2005 | von Schwerin | |
| 2006/0006446 A1 | 1/2006 | von Schwerin | |
| 2006/0046407 A1 | 3/2006 | Juengling | |
| 2006/0057814 A1 | 3/2006 | Weis | |
| 2006/0073662 A1 | 4/2006 | Jang et al. | |
| 2006/0076602 A1 | 4/2006 | Harter et al. | |
| 2006/0131651 A1 | 6/2006 | Sato et al. | |
| 2006/0189078 A1* | 8/2006 | Juengling | 438/257 |
| 2006/0231907 A1* | 10/2006 | Kim et al. | 257/401 |
| 2006/0244106 A1 | 11/2006 | Morikado | |
| 2006/0246607 A1 | 11/2006 | Fazan et al. | |
| 2006/0249779 A1* | 11/2006 | Choi et al. | 257/315 |
| 2006/0270151 A1 | 11/2006 | Lee | |
| 2006/0273415 A1 | 12/2006 | Kim | |
| 2006/0281250 A1 | 12/2006 | Schloesser | |
| 2007/0010058 A1 | 1/2007 | Juengling | |
| 2007/0018237 A1* | 1/2007 | Kim et al. | 257/324 |
| 2007/0023805 A1 | 2/2007 | Wells et al. | |
| 2007/0052040 A1 | 3/2007 | von Schwerin | |
| 2007/0111455 A1 | 5/2007 | Kim et al. | |
| 2007/0121414 A1 | 5/2007 | Butler | |
| 2007/0134878 A1 | 6/2007 | Brask et al. | |
| 2007/0145450 A1 | 6/2007 | Wang et al. | |
| 2007/0166933 A1 | 7/2007 | Song et al. | |
| 2007/0170522 A1 | 7/2007 | Lee et al. | |
| 2007/0176221 A1 | 8/2007 | Nakamura | |
| 2007/0176222 A1 | 8/2007 | Ikemasu et al. | |
| 2007/0176253 A1 | 8/2007 | Wang et al. | |
| 2007/0190736 A1 | 8/2007 | Liu et al. | |
| 2007/0262375 A1* | 11/2007 | Juengling | 257/328 |
| 2008/0012067 A1 | 1/2008 | Wu | |
| 2009/0026522 A1* | 1/2009 | Ananthan | 257/315 |
| 2009/0200540 A1* | 8/2009 | Bjoerk et al. | 257/20 |

FOREIGN PATENT DOCUMENTS

| | | |
|---|---|---|
| KR | 930005234 | 6/1993 |
| KR | 20020018071 | 3/2002 |
| TW | 380316 | 1/2000 |
| TW | 388125 | 4/2000 |
| TW | 580732 | 3/2004 |
| WO | WO 9728532 | 8/1997 |
| WO | WO 0161738 | 8/2001 |
| WO | WO 0231878 | 4/2002 |
| WO | WO 0249100 | 6/2002 |
| WO | WO 2004/038770 | 5/2004 |

OTHER PUBLICATIONS

Definition of a "fin". OED Online. 2010, Oxford University Press. http://www.oed.com/view/Entry/70312?rskey=lj9uaV&result=1 &isAdvanced=false (accessed Jan. 12, 2011).*

Enrico Gili; "Fabrication of Vertical MOSFETs With Reduced Parasitics and Suppression of Short Channel Effects"; Department of Electronics and Compter Science, Microelectronics Group; University of Southampton, Jun. 2004 http://66.102.1.104/scholar?h1=en&lr=&q=cache:BErKI49qg2MJ:www.ecs.soton.ac.uk/~eg02r/Publications/MinithesisEGili.pdf+dram+fins+%22process+flow%22+%22vertical+access%22.

F. Fishburn, et al.; "A 78nm 6F2 DRAM Technology for Multigigabit Densities".

J. Sturm, et al.; "Increased Transconductance in Fully-Depleted Ultra-Thin Sillicon-on-Insulator MOSFETs"; 6 pages.

R. Katsumata, et al.; "Fin-Array-FET on bulk silicon for sub-100 nm Trench Capacitor DRAM"; 2003 Symposium on VLSI Technology Digest of Technical Papers; Jun. 2003, pp. 61-62.

T. Park, et al.; "Fabrication of Body-Tied FinBETs (Oega MOSFETs) Using Bulk Si Wafers"; 2003 Symposium on VLSI Technology Digest of Technical Papers; Jun. 2003, 2 pages.

U.S. Appl. No. 12/033,768, filed Feb. 19, 2008, Werner Juengling.

U.S. Appl. No. 12/033,780, filed Feb. 19, 2008, Werner Juengling.

PCT International Search Report and Written Opinion dated May 12, 2009.

European Patent Office Communication Pursuant to Article 94(3) EPC dated Feb. 10, 2011.

Taiwan Office Action issued Mar. 27, 2012.

Chinese Office Action issued Jul. 23, 2012.

Taiwan Decision issued Aug. 16, 2012.

European Patent Office Communication Pursuant to Article 94(3) EPC dated Aug. 5, 2013.

* cited by examiner

SYSTEMS AND DEVICES INCLUDING FIN FIELD-EFFECT TRANSISTORS EACH HAVING U-SHAPED SEMICONDUCTOR FIN

BACKGROUND

1. Field of Invention

Embodiments of the present invention relate generally to electronic devices and, more specifically, in certain embodiments, to fin transistors.

2. Description of Related Art

Fin field-effect transistors (finFETs) are often built around a fin (e.g., a tall, thin semiconductive member) extending generally perpendicularly from a substrate. Typically, a gate traverses the fin by conformally running up one side of the fin, over the top, and down the other side of the fin. In some instances, the gate is disposed against the sides of the fin and does not extend over the top. Generally, a source and a drain are located on opposite sides of the gate near the ends of the fin. In operation, a current through the fin between the source and drain is controlled by selectively energizing the gate.

Some finFETs include gates formed with a sidewall-spacer process. In some versions of this process, the gates are formed by covering a fin with a conformal, conductive film and, then, anisotropically etching the conductive film. During the etch, the conductive material is removed faster from the horizontal surfaces than from the vertical surfaces. As a result, a portion of the conductive material remains against the vertical sidewalls of the fins. An advantage of this process is that relatively narrow gates can be formed relative to gates patterned with photolithography, which is often subject to alignment and resolution constraints.

Although forming gates with a sidewall-spacer process avoids some process issues, it can introduce other failure mechanisms. Often the sidewalls of the fins are angled rather than vertical because the fins were formed with an etch step that was less than perfectly anisotropic. These angled sidewalls can narrow, and in some cases close, the process window for the sidewall spacer process. The angles place the bases of adjacent fins closer to one another, and when the conformal film is deposited in this narrower gap, the portions of the film covering the adjacent sidewalls can join, creating a film with a larger vertical thickens in the gap. The film can become so thick in the gap that the sidewall-spacer etch does not remove all of the conductive film between adjacent gates. The resulting conductive residue forms stringers that short adjacent finFETs and lower yields.

DETAILED DESCRIPTION

The problems discussed above may be mitigated by some of the subsequently described embodiments. Among these embodiments is an example of a manufacturing process that forms insulating fins between adjacent gates. As explained below, in some embodiments, both insulating fins and semiconductor fins are formed by a single etch that defines furrows between the insulating fins and semiconductor fins. The furrows, in turn, may define the shape and position of gates formed in the furrows. Because the gates are formed in furrows separated by insulating fins, in some embodiments, the gates are believed to be more reliably isolated from one another than gates formed with conventional techniques. This manufacturing process and some of its variants are described below with reference to FIGS. 1-22.

Figure 1:
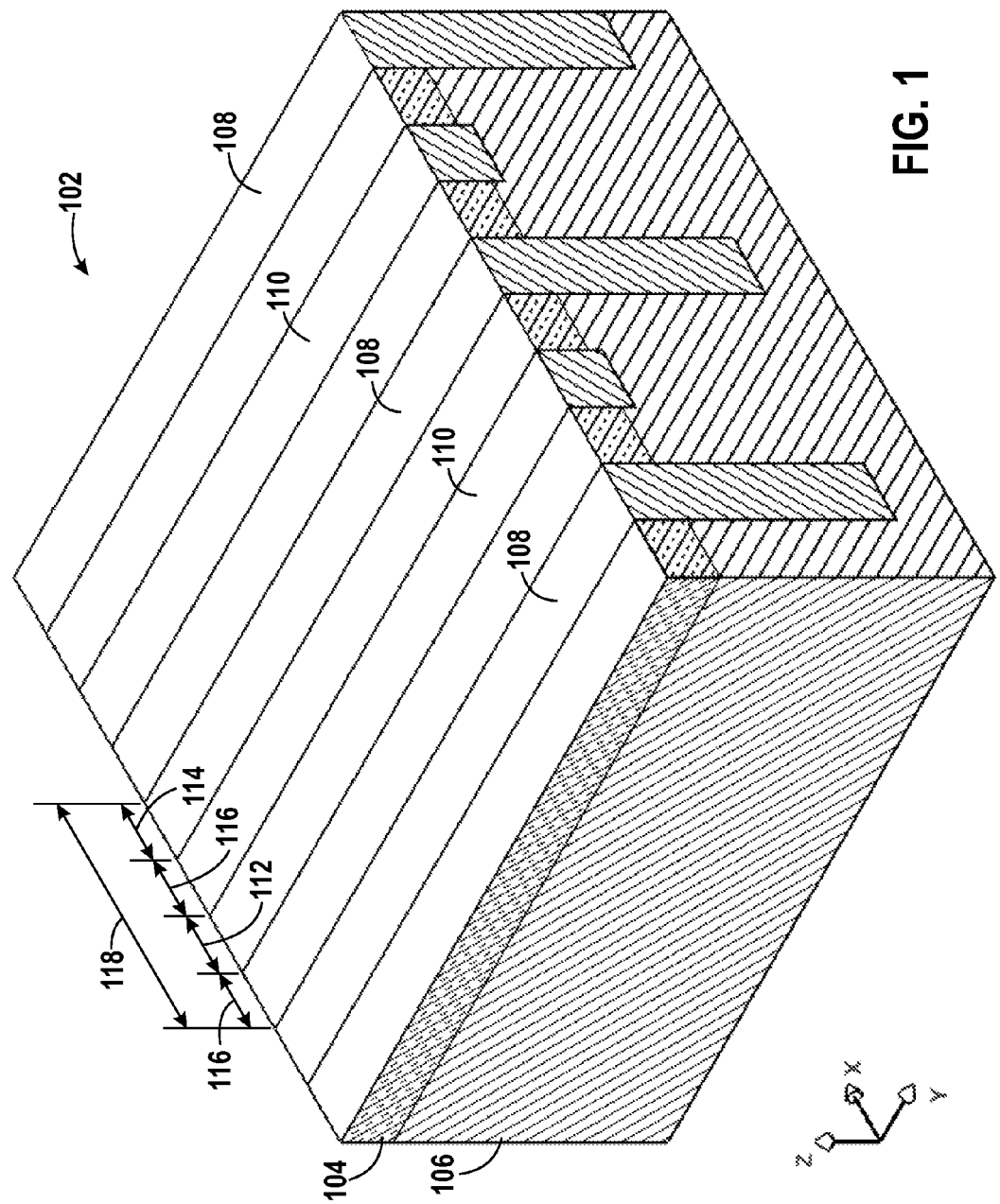
FIGS. 1-22 are cross-sectional views of a substrate during sequential stages of a manufacturing process in accordance with an embodiment of the present technique.

As illustrated by FIG. 1, the manufacturing process begins with providing a substrate 102. The substrate 102 may include semiconductive materials such as single-crystal or poly-crystalline silicon, gallium arsenide, indium phosphide, or other materials with semiconductor properties. Alternately, or additionally, the substrate 102 may include a non-semiconductor body on which an electronic device may be constructed, structures such as a plastic or ceramic work surface, for example. The term "substrate" encompasses bodies in a variety of stages of manufacture, including an unprocessed whole wafer, a partially-processed whole wafer, a fully-processed whole wafer, a portion of a diced wafer, or a portion of a diced wafer in a packaged electronic device.

In this embodiment, the substrate 102 includes an upper doped region 104 and a lower doped region 106. The upper doped region 104 and the lower doped region 106 may be differently doped. For example, the upper doped region 104 may include an n+ material and the lower doped region 106 may include a p– material. The depth of the upper doped region 104 may be generally uniform over a substantial portion of the substrate 102, such as throughout a substantial portion of an array area of a memory device, for example. The upper doped region 104 and the lower doped region 106 may be doped by implanting or diffusing dopant materials. Alternatively, or additionally, one or both of these regions 104 or 106 may be doped during growth or deposition of all or part of the substrate 102, such as during epitaxial deposition of a semiconductive material or during growth of a semiconductive ingot from which wafers are cut. As explained below, the upper doped region 104 may provide material used to form a source and a drain of a transistor, and the lower doped region 106 may provide material used to form a channel of the transistor.

Deep isolation trenches 108 and shallow trenches 110 may be formed in the substrate 102. These trenches 108 and 110 may generally extend in the Y direction, as indicated in FIG. 1. One or more shallow trenches 110 may be interposed between pairs of the deep isolation trenches 108. In some embodiments, the shallow trenches 110 may be deeper than the upper doped region 104 to separate subsequently-formed sources and drains. Additionally, the deep isolation trenches 108 may be deeper than the shallow trenches 110 to isolate subsequently-formed transistors.

The deep isolation trenches 108 and the shallow trenches 110 may define several dimensions of the substrate 102. The shallow trenches 110 have a width 112 less than F, where F is the resolution of the equipment with which the deep isolation trenches are patterned. Similarly, the deep isolation trenches 108 may have a width 114 less than F, and the deep isolation trenches 108 may be spaced away from the shallow trenches 110 by a width 116 that is less than F. In some embodiments, one or more or all of these widths 112, 114, and 116 is less than or generally equal to ¾ F, ½ F, or ¼ F. The trenches 108 and 110 repeat with a period of 118, which in some embodiments is less than or generally equal to 4 F, 2 F, or 1 F. In other embodiments, the pattern may be interrupted with other structures or variation in the pattern. The deep isolation trenches 108 and/or shallow trenches 110 may have a generally rectangular or trapezoidal cross-section, and, in some embodiments, their cross-section may be generally uniform through some distance in the Y direction, for example through a distance larger than one, two, five, or more transistor lengths.

A variety of process flows may be used to form the deep isolation trenches 108 and the shallow trenches 110. In some embodiments, they are formed sequentially, each with a double-pitched mask. In one example of such a process, the deep isolation trenches 108 are formed first by masking off the areas between every other pair of deep isolation trenches 108 and, then, forming a poly-silicon sidewall spacer on the sides of the mask, over the areas corresponding to each of the deep isolation trenches 108. Then the mask may be removed and a hard mask material, such as oxide, may be deposited over the remaining poly-silicon sidewall spacers, and the hard mask material may be etched back or planarized with chemical mechanical planarization (CMP) to expose the poly-silicon. Next, the poly-silicon may be selectively etched to form openings in the oxide hard mask through which the deep isolation trenches 108 may be etched. The shallow trenches 110 may be formed with a similar flow, except with the initial mask shifted by some distance, e.g., the width 116, and with a shallower etch. In other embodiments, these structures 108 and 110, like many others discussed herein, may be formed with process flows.

The deep isolation trenches 108 and shallow trenches 110 may be partially or entirely filled with various dielectric materials, such as high density plasma (HDP) oxide, tetra-ethyl-ortho-silicate (TEOS), or spun-on-glass (SOG), for instance, to electrically isolate features. Additionally, the deep isolation trenches 108 or the shallow trenches 110 may include various liner materials, such as silicon nitride for example, to relieve film stresses, improve adhesion, or function as a barrier material. In some embodiments, prior to being filled, the bottom of the deep isolation trenches 108 is implanted with dopants selected to further isolate the transistors.

Figure 2:
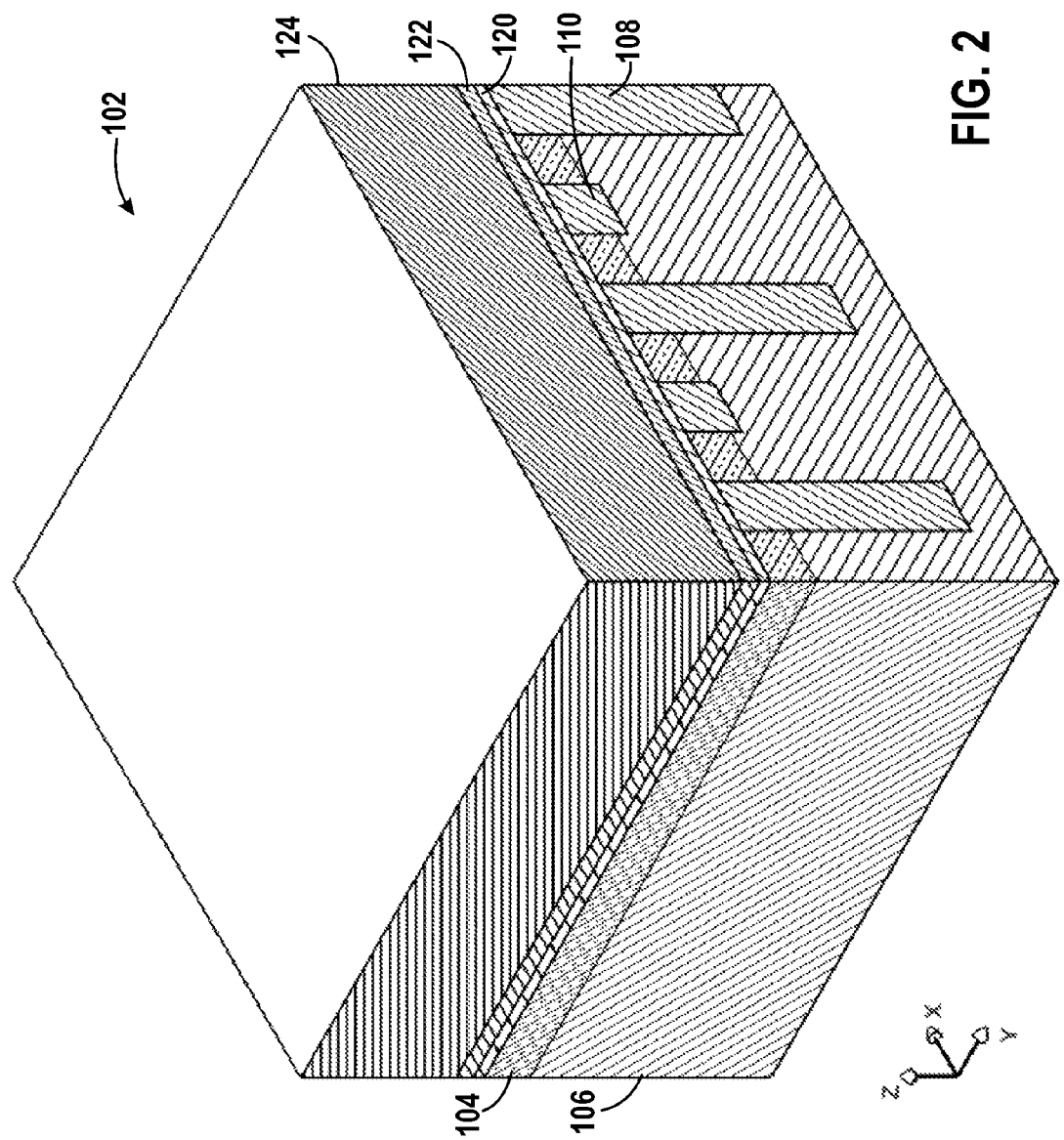

Next, in this embodiment, three-different films are formed on the substrate 102, as illustrated by FIG. 2. The first illustrated film is a lower stop region 120. In this embodiment, the lower stop region 120 is a layer of oxide that is either grown or deposited, depending in part on whether the bulk semiconductor material of the substrate 102 readily forms a native oxide, as occurs with materials like silicon. For example, the lower stop region 120 may be grown on silicon by reacting the surface of the silicon portion of the substrate 102 with oxygen in a furnace, or the lower stop region 120 may be deposited with chemical-vapor deposition (CVD) on substrates with a variety of types of semiconductor materials, including both silicon and compound semiconductors. The lower stop region 120 may be between 20 and 200 Å thick, e.g., generally near 80 Å thick.

The lower stop region 120 may be made of a different material from the next region: an upper stop region 122. In this embodiment, the upper stop region 122 is made of nitride deposited with CVD. The upper stop region 122 may be between 30 and 300 Å thick, e.g., generally near 100 Å thick. As explained below, in some embodiments, the transition between the upper stop region 122 and the lower stop region 120 may reduce over etching by signaling the appropriate time to stop etching or by slowing the etch rate before the upper doped region 104 is penetrated.

Next in the illustrated embodiment, a sacrificial mask region 124 is formed, as illustrated by FIG. 2. The sacrificial mask region 124 may be made of poly-silicon deposited with a CVD system, and it may have a thickness between 500 and 5000 Å, e.g., generally near 1500 Å thick. The thickness of the sacrificial mask region 124 may be selected based on a desired semiconductor-fin height. As explained below, in this embodiment, the sacrificial mask region 124 forms a hard mask for the etch step that defines the semiconductor fins. A portion of the hard mask is consumed during the fin etch, so the longer the semiconductor fins, and the deeper the fin etch, the thicker the sacrificial mask region 124 may be.

Figure 3:
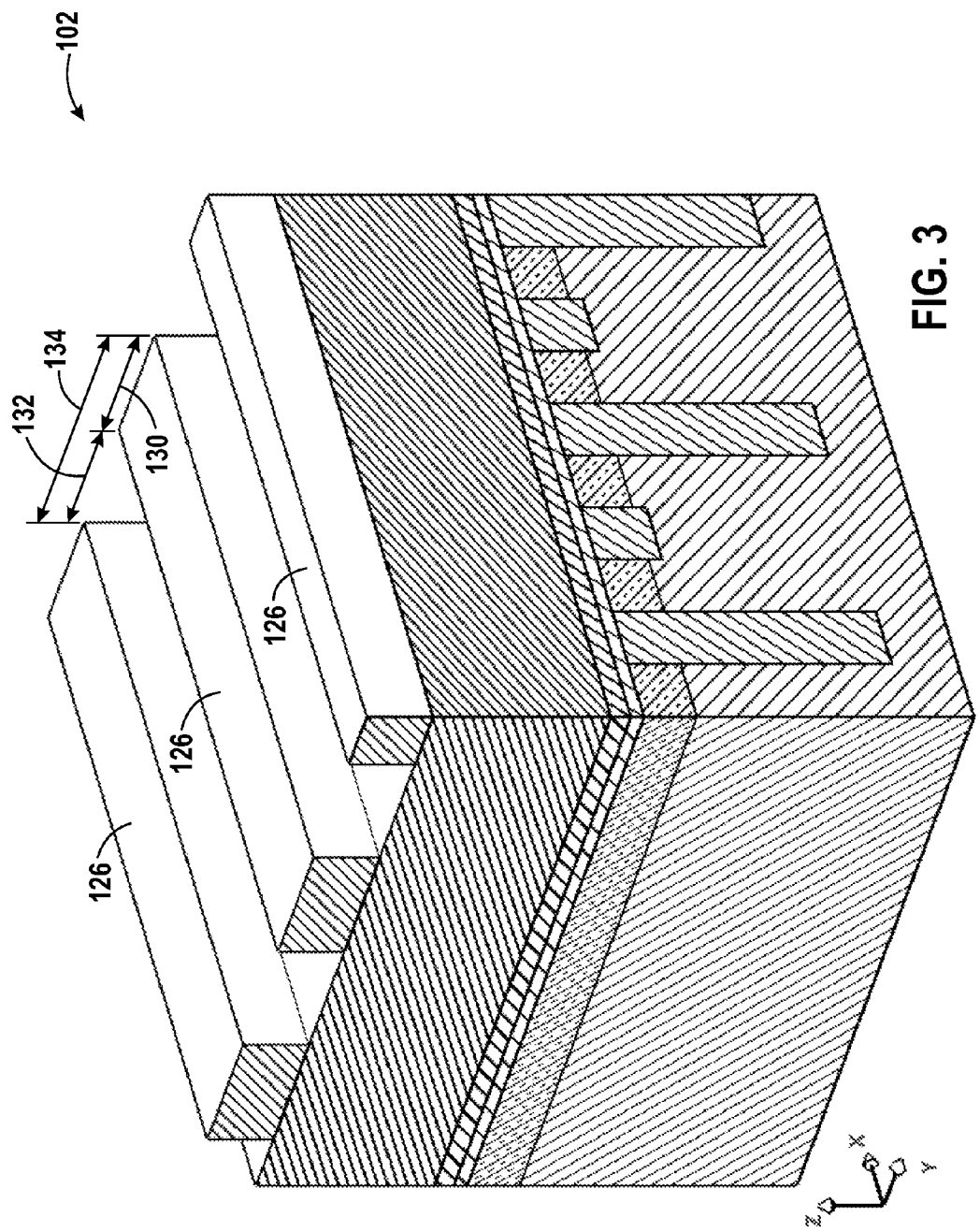
Figure 4:
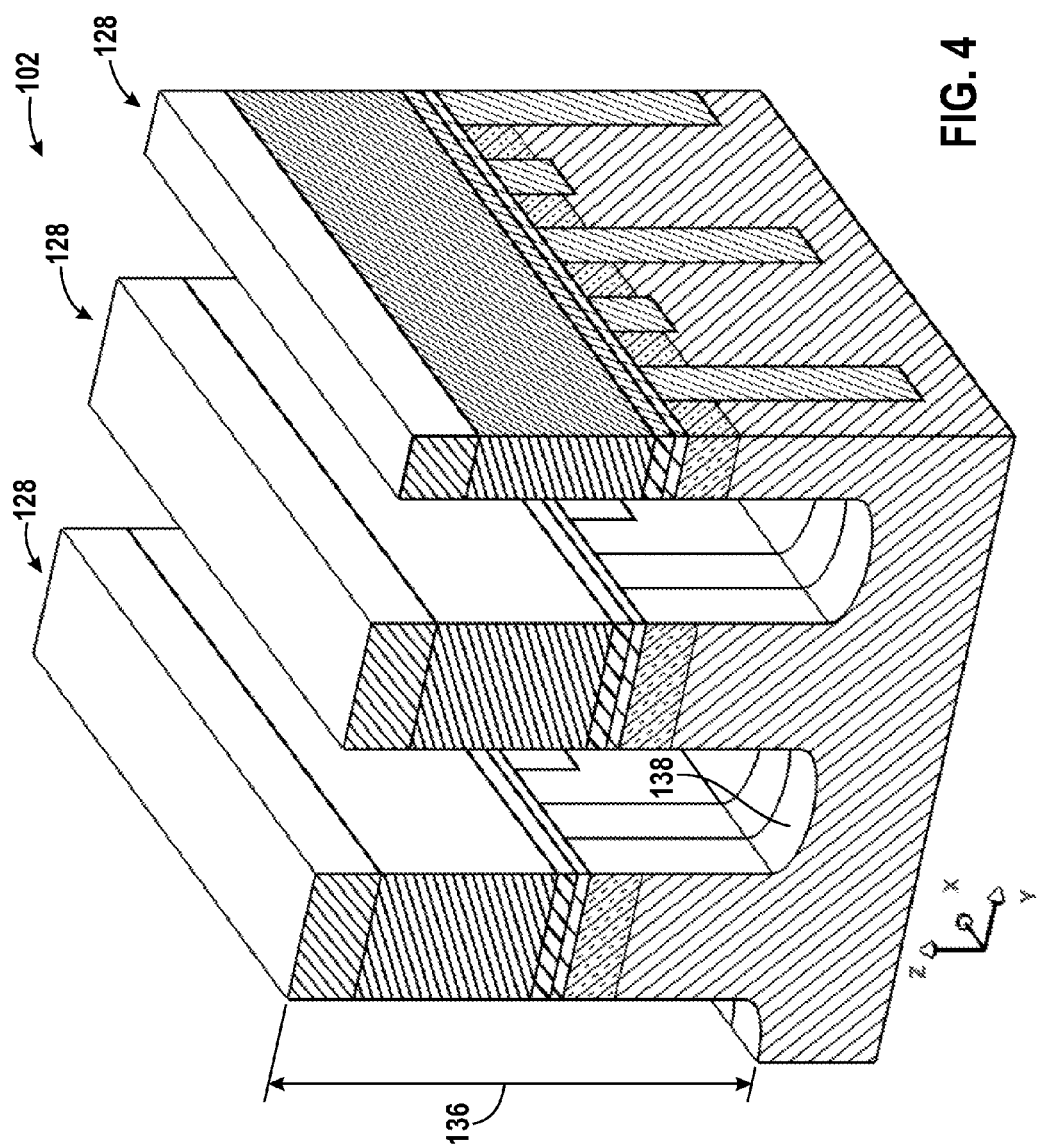

After forming the films illustrated by FIG. 2, the substrate 102 is patterned, as illustrated by FIGS. 3 and 4. FIG. 3 illustrates a precursor-fin mask 126, and FIG. 4 illustrates precursor fins 128 formed by etching regions exposed by the precursor-fin mask 126. The precursor-fin mask 126 may be made of photoresist, or the mask 126 may be a hard mask formed by depositing and patterning a masking material. The precursor-fin mask 126 may be patterned with a variety of lithography systems, such as a photolithography system, a nano-imprint system, an electron-beam system, or other appropriate patterning device. The illustrated precursor-fin mask 126 includes a series of masked regions 130 and exposed regions 132, both generally extending in the X direction. Both the masked regions 130 and the exposed regions 132 may have a width generally equal to 1 F, and it follows that the precursor-fin mask 126 may have a period 134 near 2 F.

In certain embodiments, the precursor-fin mask 126 has a relatively large alignment margin compared to some conventional processes. In this embodiment, many of the existing structures on the substrate 102, such as the deep isolation trenches 108 and the shallow trenches 110 are generally uniform in the Y direction. As a result, in this embodiment, the mask 126 can be shifted slightly, or misaligned, along the Y direction without significantly affecting the ultimate shape of the transistors. Similarly, because the mask 126 is generally uniform in the X direction, some misalignment of the trenches 108 and 110 in the X direction may be acceptable in some embodiments.

After forming the precursor-fin mask 126, the precursor-fins 128 may be etched, as illustrated by FIG. 4. In some embodiments, this etch may be a generally anisotropic dry etch. The precursor fins 128 may have dimensions that are generally complementary to the dimensions of the precursor-fin mask 126. The etch may form voids that generally extend along the Z axis a distance 136 into the substrate 102. The distance 136 may be selected so that bottoms 138 of the voids are substantially deeper than the shallow trenches 110, but not as deep as the deep isolation trenches 108.

Figure 5:
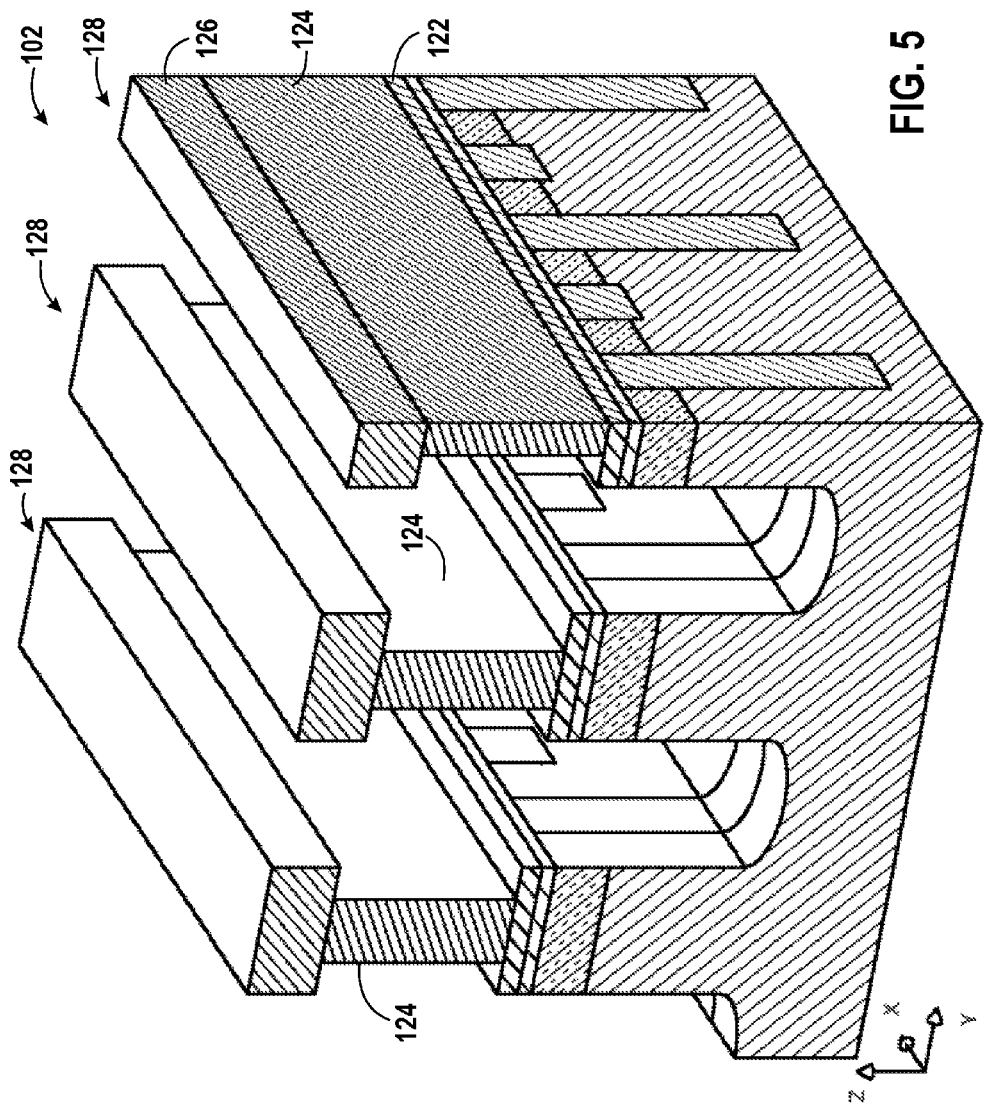
Figure 6:
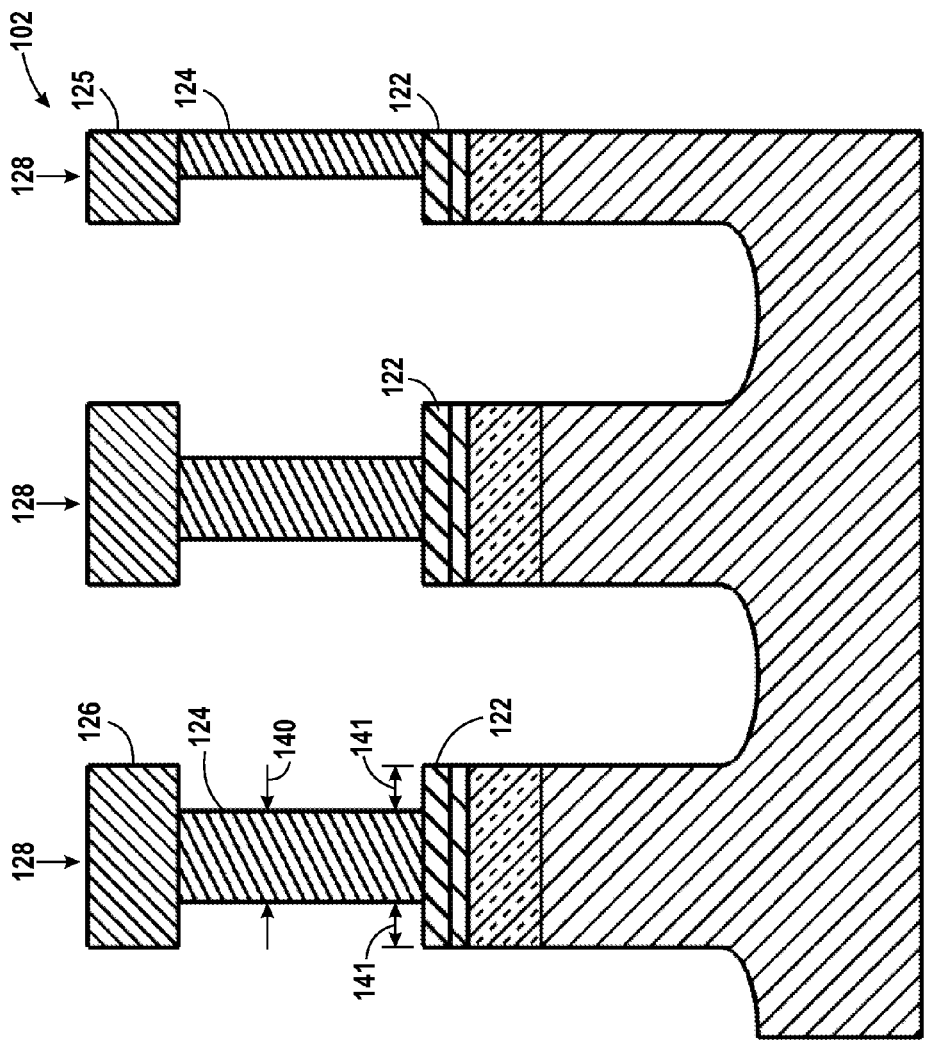

Next, as illustrated by FIGS. 5 and 6, the sacrificial-masking-region portion 124 of the precursor fins 128 may be undercut. The substrate 102 may be placed in a wet-etch bath that is selective to the material from which the sacrificial masking region 124 is made, e.g., a wet etch that preferentially etches poly-silicon but removes the other materials on the substrate 102 at a substantially slower rate. Because wet etches are generally isotropic, and because the top and bottom of the sacrificial masking region 124 is covered by other regions 126 and 122, the wet etch may primarily remove material from the vertical surfaces of the sacrificial masking region 124, in the X and the Y directions, thereby narrowing its width 140. In some embodiments, the width 140 may be generally equal to or less than ¼ F, ½ F, ¾ F or 1 F. The sacrificial masking region 124 may be undercut by a distance 141 that is generally equal to or greater than ⅜ F, ¼ F, ⅛ F, or some other distance. In some embodiments, the distance 141 may be generally equal to or greater than 15 nm. As described below, the narrower sacrificial masking region 124 may define narrower semiconductor fins. In some embodiments, the sacrificial masking region 124 may be undercut during the etch that forms the precursor fins 128.

Figure 7:
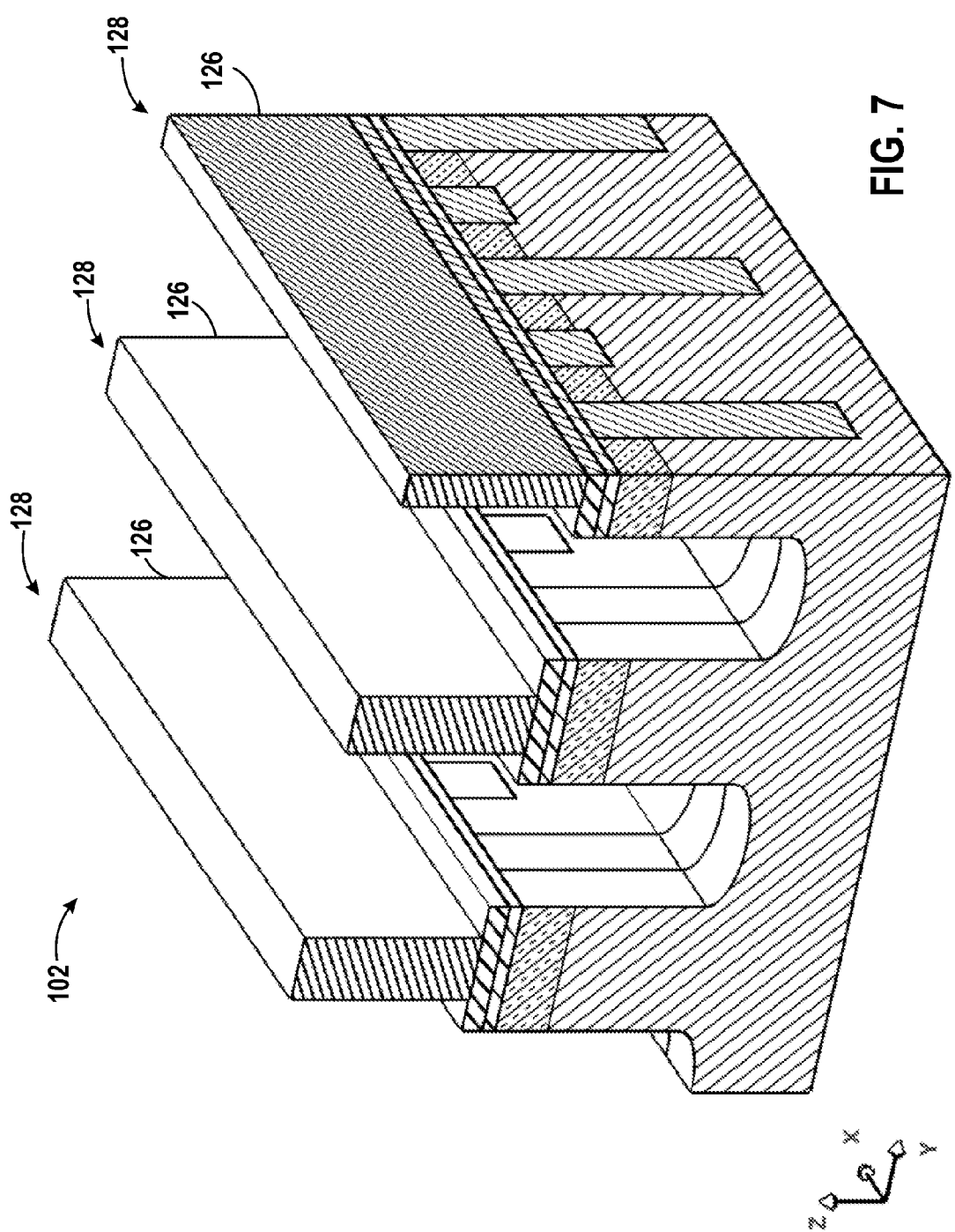

Next, the precursor-fin mask 126 is removed, as illustrated by FIG. 7. The precursor-fin mask 126 may be removed with a wet etch that is selective to the precursor-fin mask 126, or the precursor-fin mask 126 may be removed by reacting the precursor-fin mask 126 with oxygen in a furnace or a plasma etch chamber.

Figure 8:
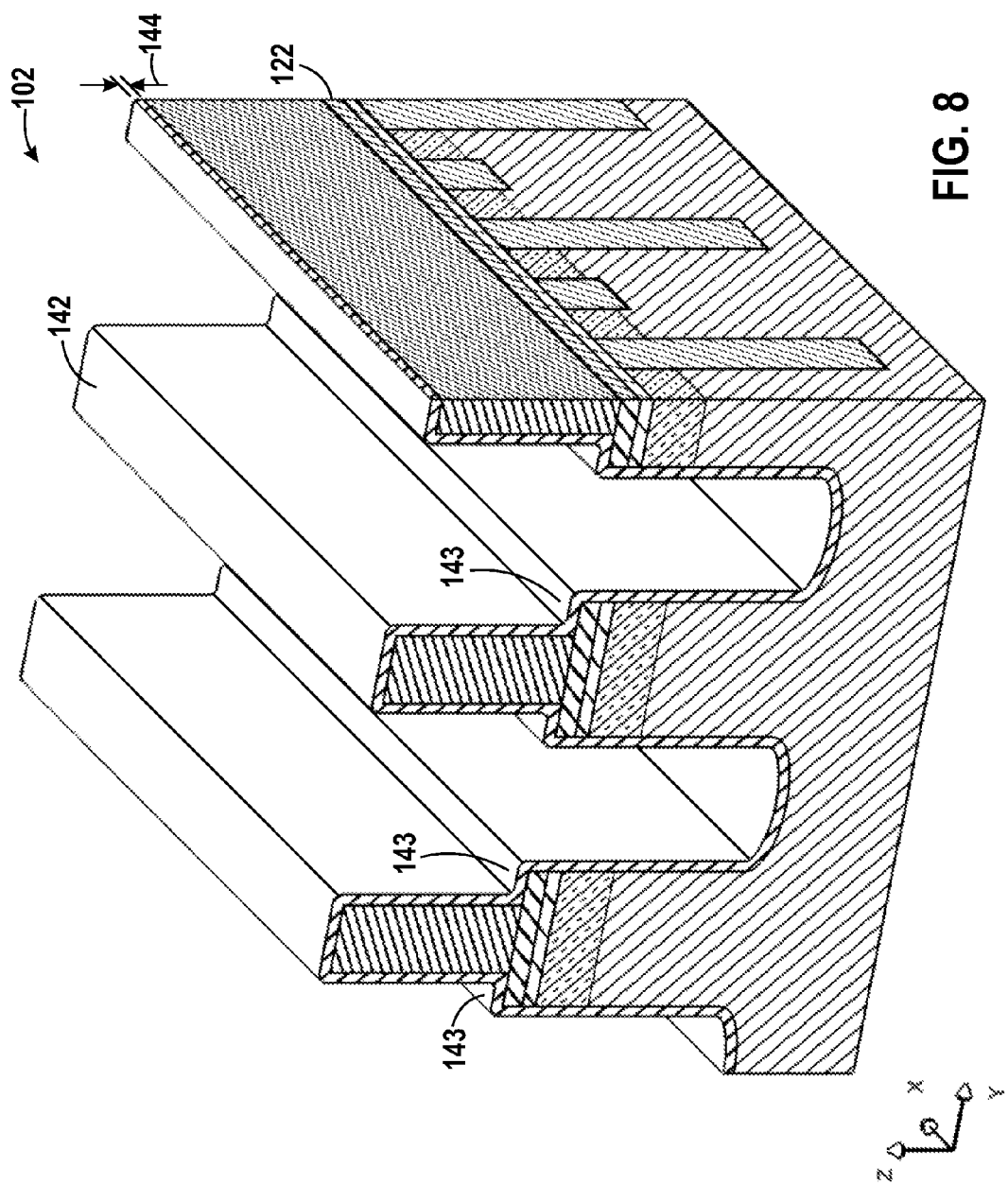

As illustrated by FIG. 8, a liner 142 may be formed on the substrate 102. In this embodiment, the liner 142 is a generally conformal nitride film deposited with chemical-vapor deposition or other type of deposition. In some embodiments, the liner 142 is made of the same material as the upper stop region 122 or other suitable material, for example. The liner 142 may have a thickness 144 that is generally equal to or less than the width 142 of the undercut of the sacrificial masking region 124 (FIG. 6). The illustrated liner 142 includes shoulders 143 that define a compound curve with two generally 90-degree changes in direction. As explained below, in some embodiments, these shoulders 143 protect the portion of the liner 142 below the shoulder 143 when etching the portion of the liner 142 above the shoulder 143. Thus, the shoulder 143 functions in some embodiments as a stop region.

Figure 9:
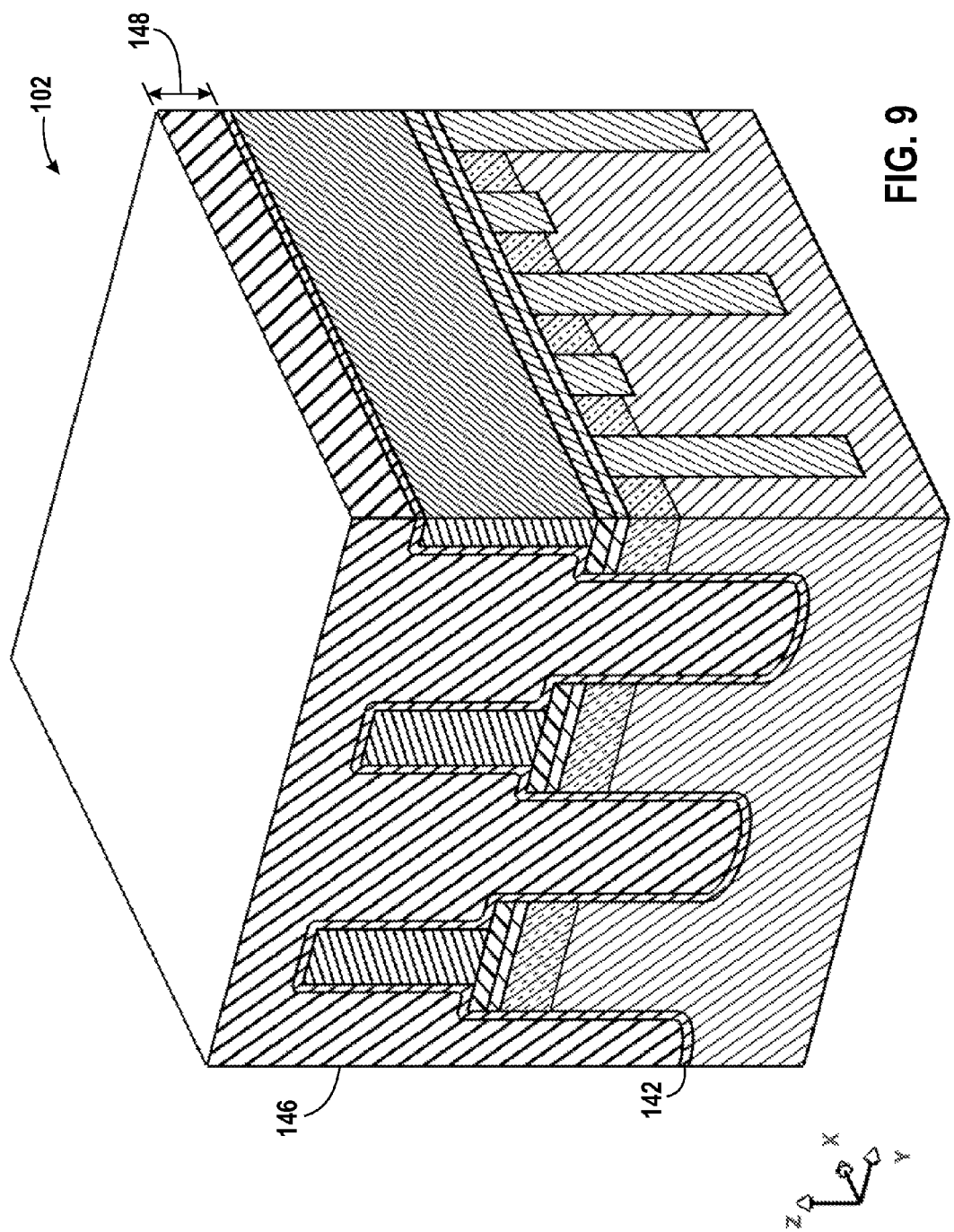

Next, an inter-gate dielectric 146 is formed, as illustrated by FIG. 9. In this embodiment, the inter-gate dielectric 146 is a spun-on dielectric (SOD) applied with an overburden 148. In other embodiments, it may be a different material applied with a different process, e.g., CVD or ALD. The spun-on dielectric may be a spun-on glass, such as oxide, and in some embodiments, the spun-on dielectric may be densified by placing the substrate 102 in a furnace to drive volatile compounds from the spun-on dielectric. In some embodiments, the liner 142 may protect other portions of the substrate 102 from film stresses developed during densification.

Figure 10:
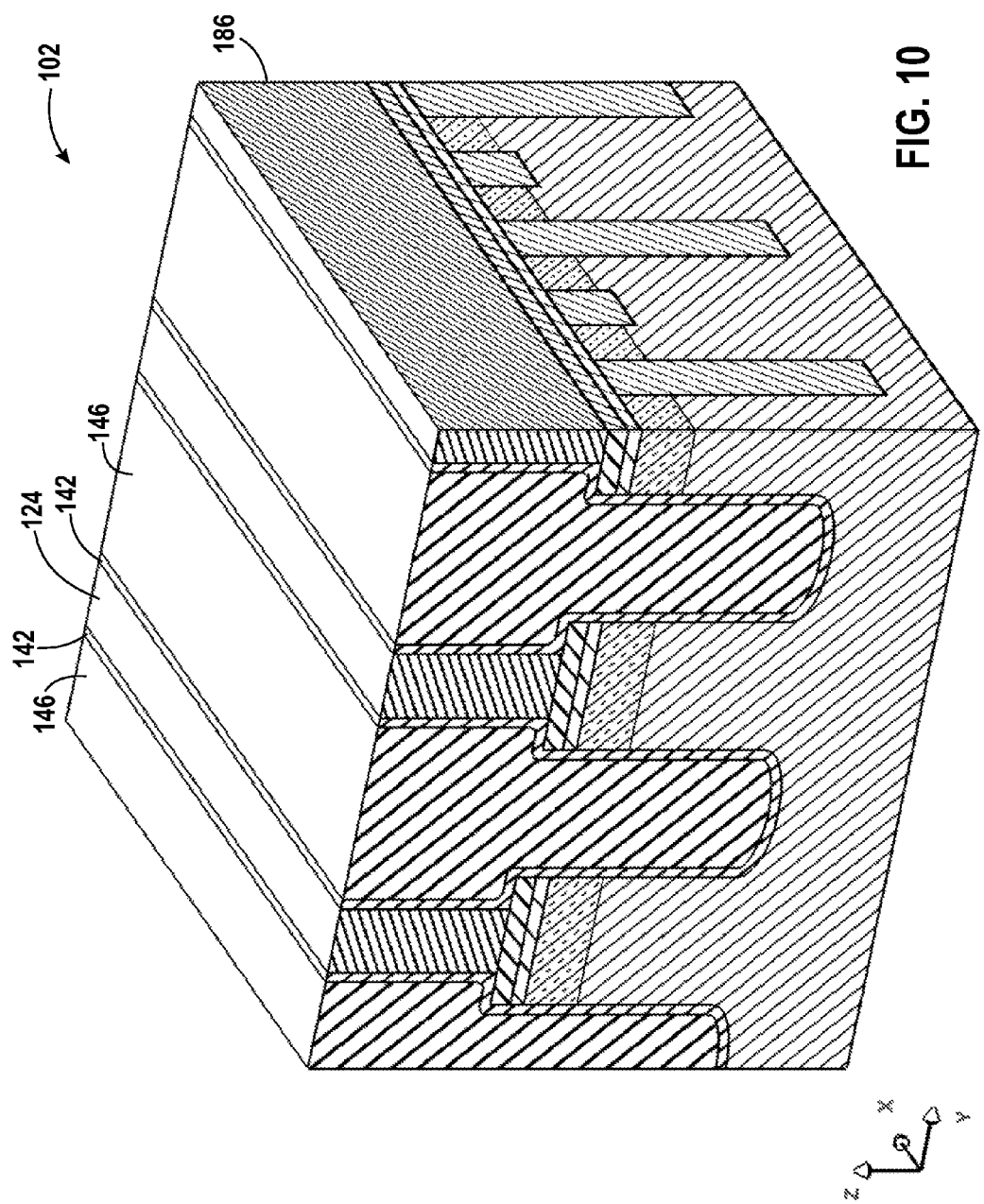

After forming the inter-gate dielectric 146, the substrate 102 may be generally planarized with chemical-mechanical planarization (CMP), as illustrated by FIG. 10. The CMP process may remove the overburden 148, a top portion of the liner 142, and stop on or near the sacrificial-masking region 124. The transition between the inter-gate dielectric 146 and the liner 142 may produce a detectable phenomenon, such as a change in optical properties of the substrate (e.g., color), chemical properties (e.g., waste slurry pH), or mechanical properties (e.g., sliding friction) that triggers an end to the CMP process. The transition between the liner 142 and the sacrificial masking region 124 may also produce similar detectable phenomena for end-pointing the process. In some embodiments, the CMP process stops on or near the liner 142 and does not expose the sacrificial masking region 124.

Figure 11:
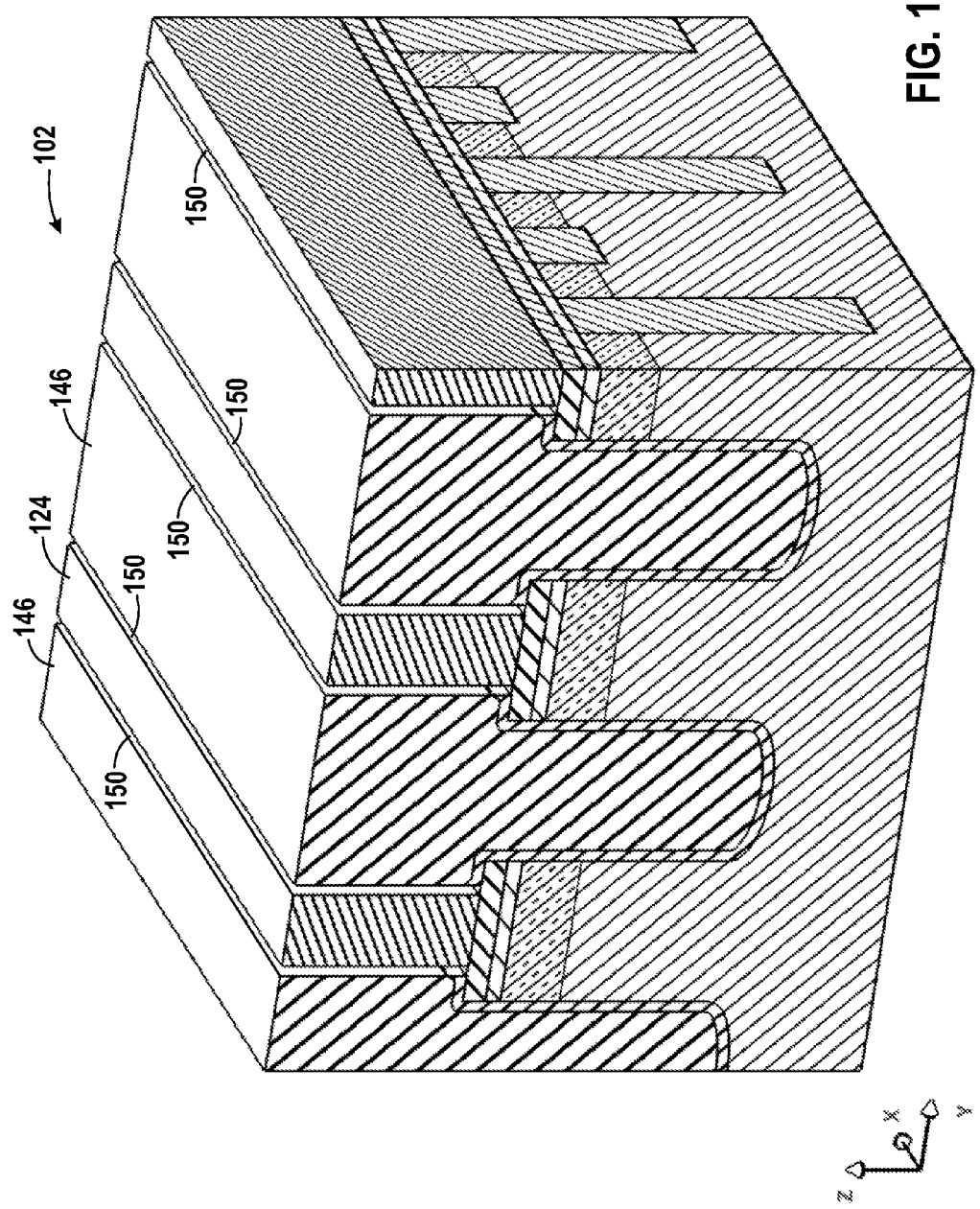
Figure 12:
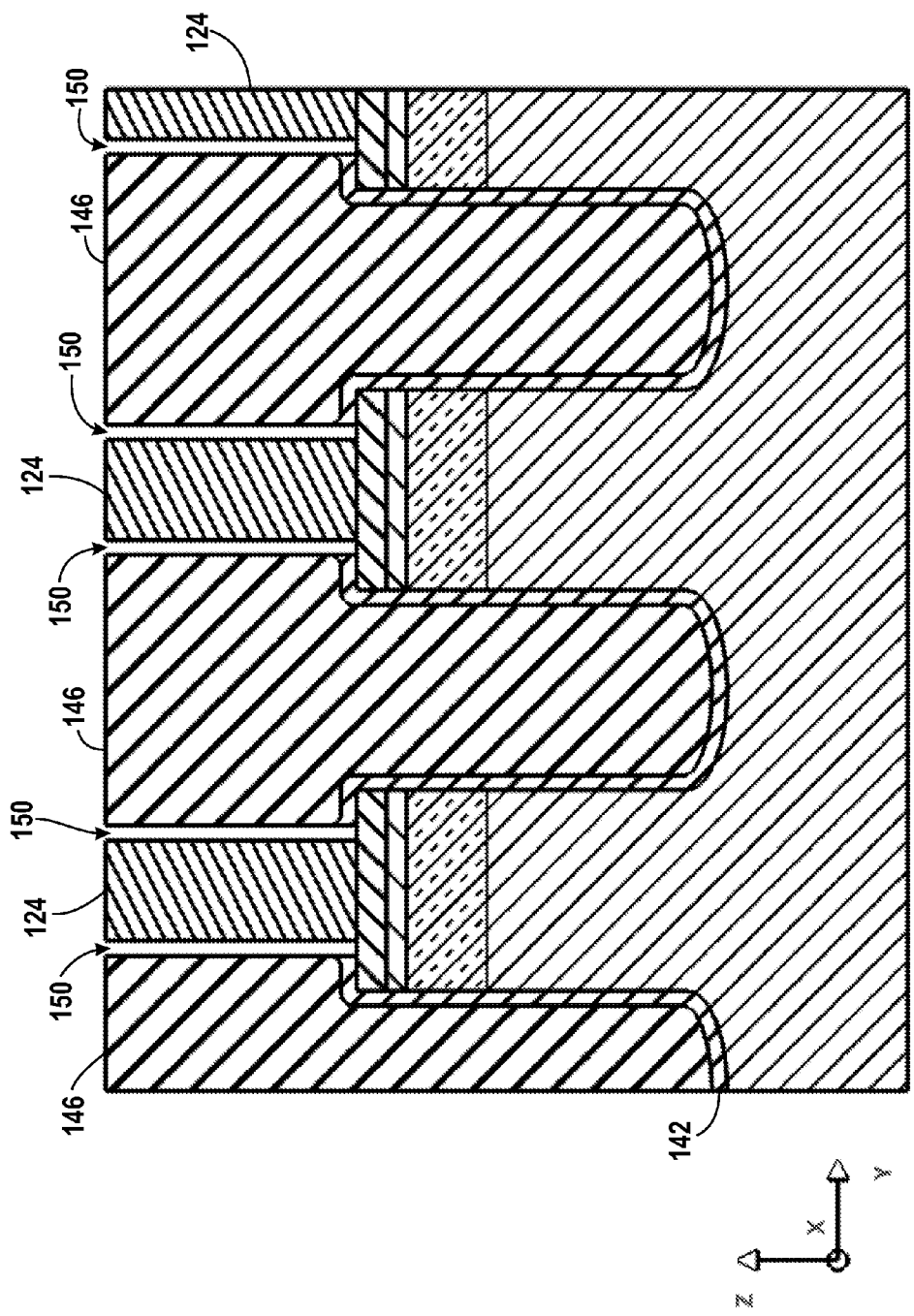

Next, the portion of the liner 142 above the shoulder 143 is removed, as illustrated by FIGS. 11 and 12. The liner 142 may be removed with a dry etch that is generally selective to the liner 142 so that the liner 142 is etched without removing a substantial portion of either the sacrificial-masking region 124 or the inter-gate dielectric 146. In this embodiment, the etch stops on or near the shoulder 143, and a substantial portion or all of the liner 142 below the shoulder 143 remains in place. In some embodiments, the etch may penetrate into the upper stop region 122 and stop on the lower stop region 120. Removing the upper portion of the liner 142 opens gaps 150 between alternating members of the sacrificial masking region 124 and the inter-gate electric 146. In this embodiment, the gaps 150 expose the sidewalls of the inter-gate dielectric 146 for the next process step.

Figure 13:
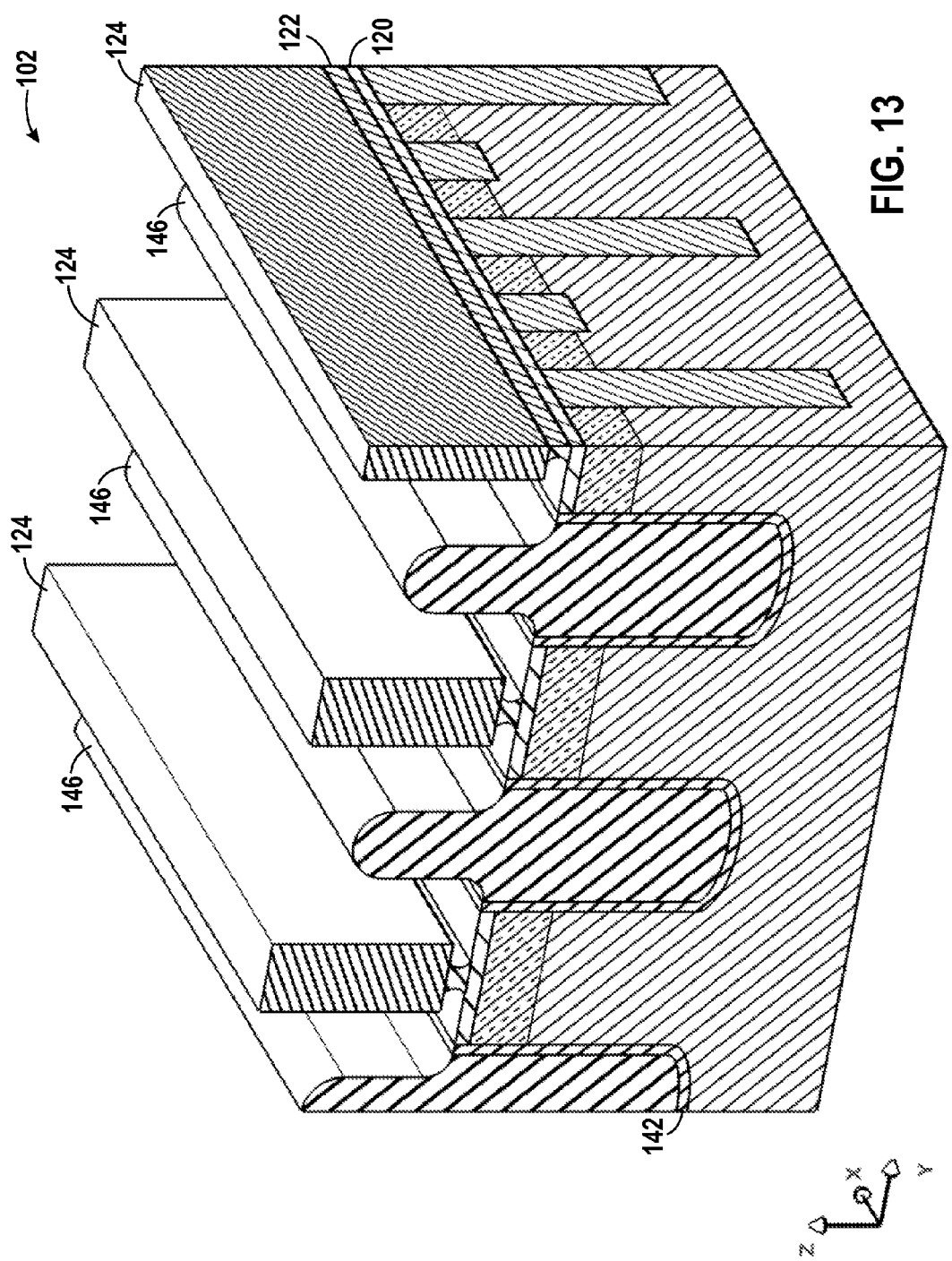
Figure 14:
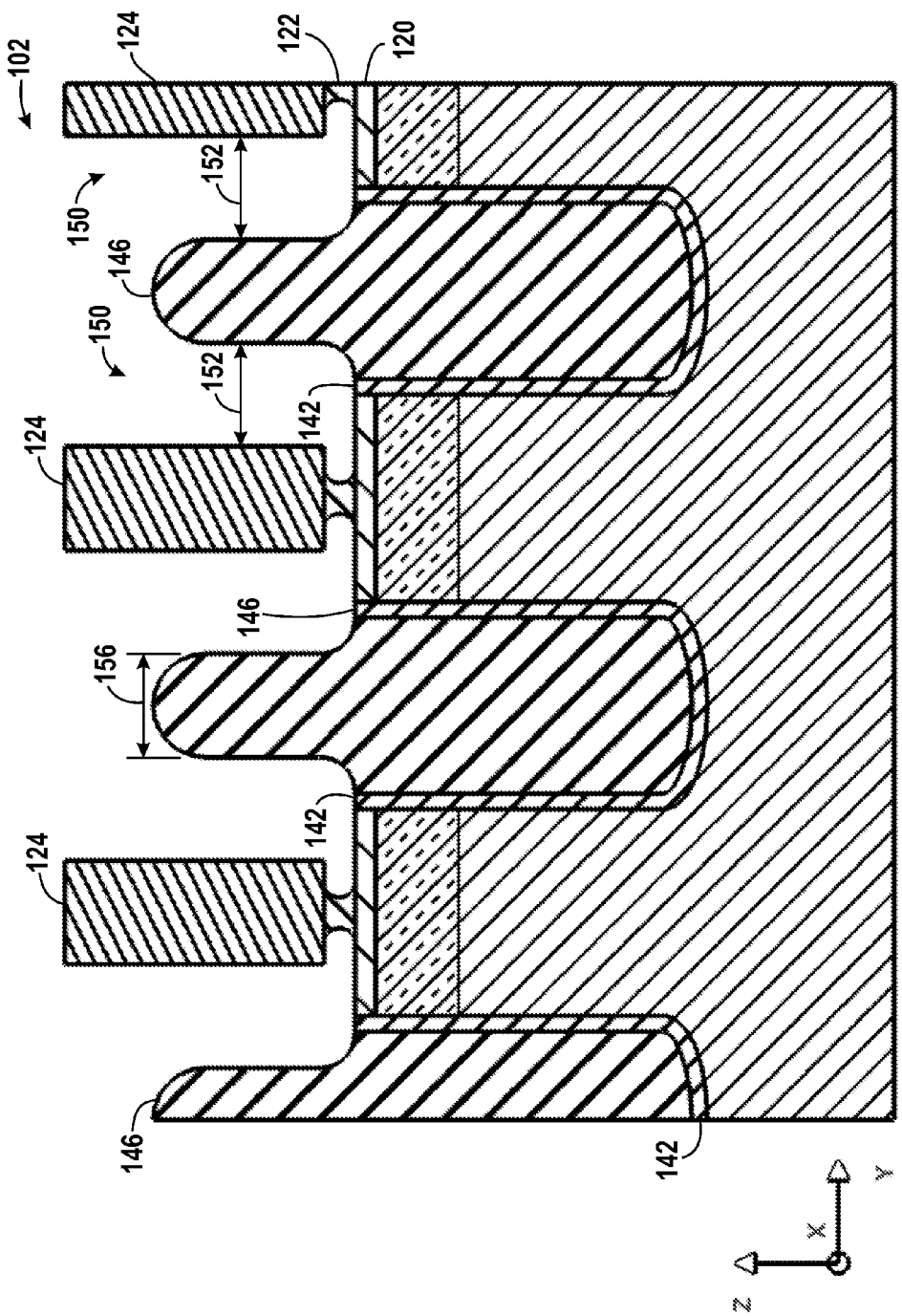

After forming the gaps 150, they may be widened, as illustrated by FIGS. 13 and 14. In this embodiment, the gaps 150 are widened by wet etching the substrate 102. The etchant penetrates the gaps 150 and reacts with the sidewalls of the inter-gate dielectric 146. The wet etch may be generally isotropic and generally selective to the inter-gate dielectric 146 so that relatively little of the sacrificial masking region 124 is removed. In some embodiments, the wet etch undercuts a portion of the upper stopping region 122 under the sacrificial masking region 124. The gaps 150 may be widened to a width 152, and the inter-gate dielectric 146 may be narrowed to a width 156. In some embodiments, both the width 156 and the width 152 may be less than F, e.g., generally equal to or less than ¾ F, ½ F, or ¼ F. As explained below, the width 152 may generally define the width of the gates for each of the transistors.

Figure 15:
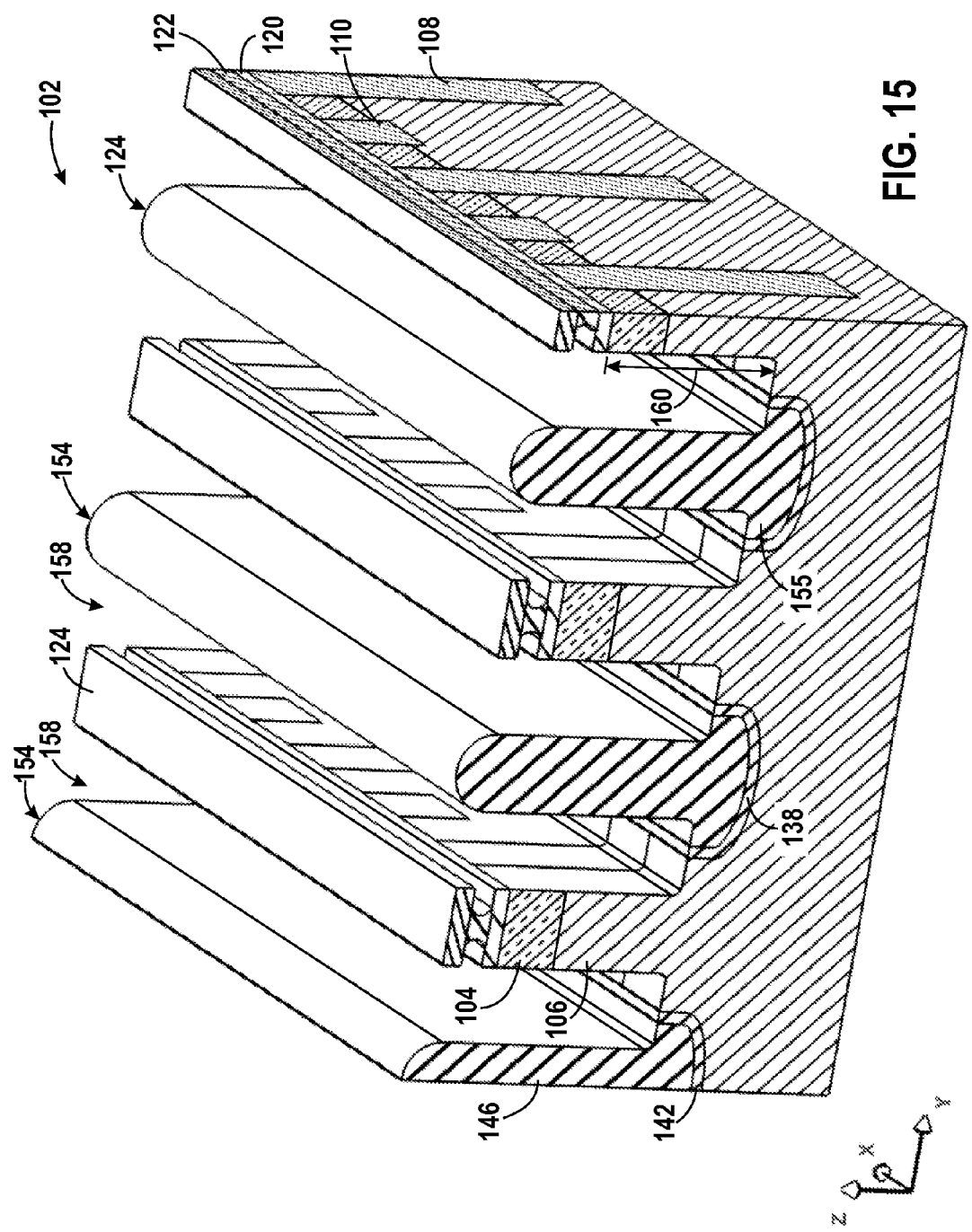
Figure 16:
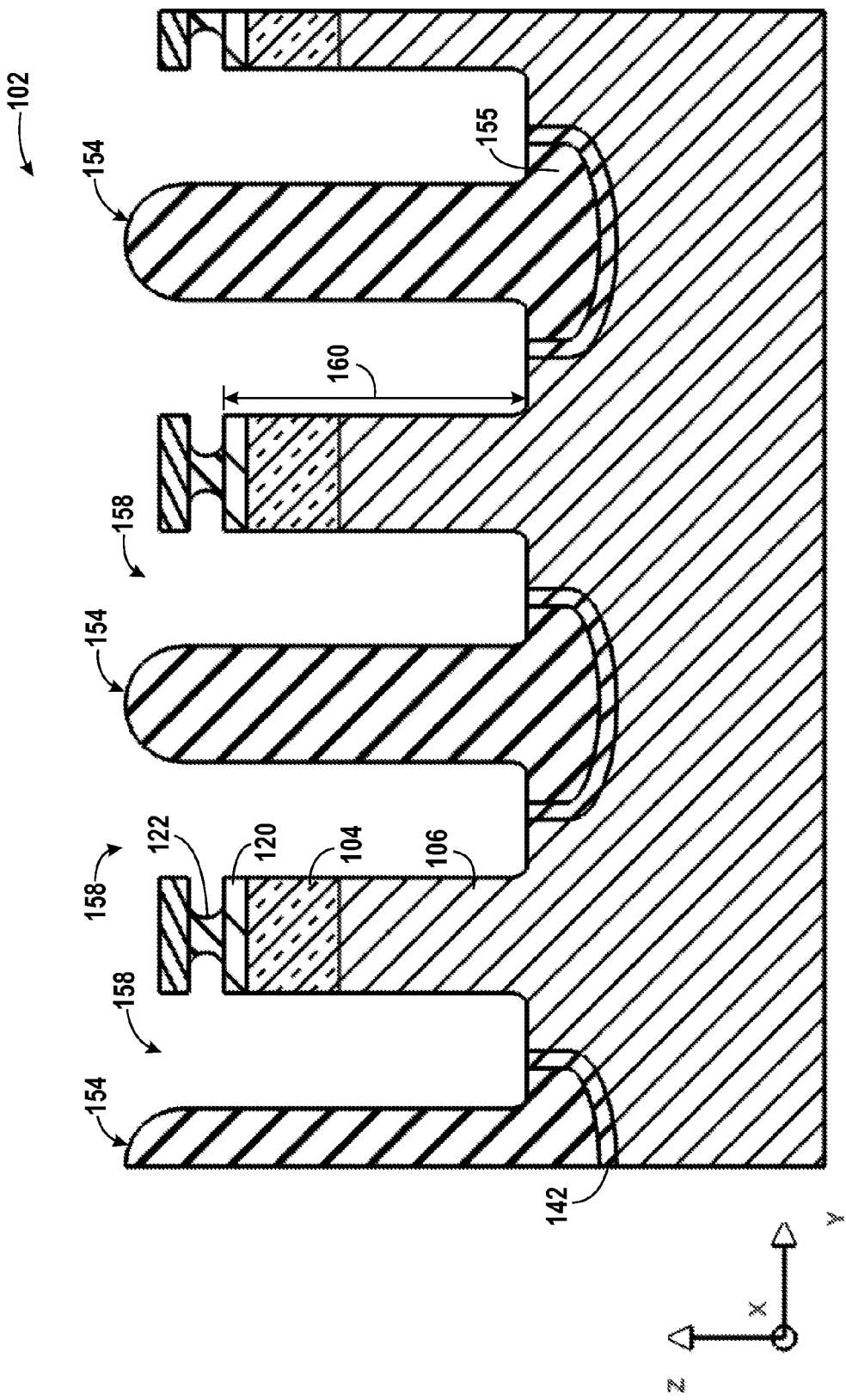

Next in the presently described embodiment, the substrate 102 is anisotropically etched, as illustrated by FIGS. 15 and 16. In this embodiment, the anisotropic etch preferentially removes material in the Z direction and is generally not selective to many or all of the exposed materials of the substrate 102. For example, the etch may generally etch the inter-gate dielectric 146, the sacrificial masking region 124, the upper doped region 104, and the lower doped region 106 at generally the same rate. This etch may be the type of etch known in the art as an "alligator etch."

As illustrated by FIGS. 15 and 16, the presently described etch changes a number of features of the substrate 102. A substantial portion or all of the sacrificial masking region 124 may be removed, and furrows 158 may be opened in both the upper doped region 104 and the lower doped region 106. The illustrated furrows 158 may also consume a portion of the liner 142. The furrows 158 may have a depth 160 below the top of the upper doped region 104 that is deeper than the shallow trenches 110, but not as deep as either the deep isolation trenches 108 or the bottom 138 of the space between the precursor fins 128 (FIG. 4). The sidewalls of the furrows 158 may be generally parallel to the Z direction, or they may be sloped or curved. The etch may also reduce the thickness of the inter-gate dielectric 146 and generally define insulating fins 154. The insulating fins 154 may have a base 155 that defines a bottom portion of the furrows 158. As explained below, the insulating fins 154 may separate gates of adjacent rows of transistors.

Figure 17:
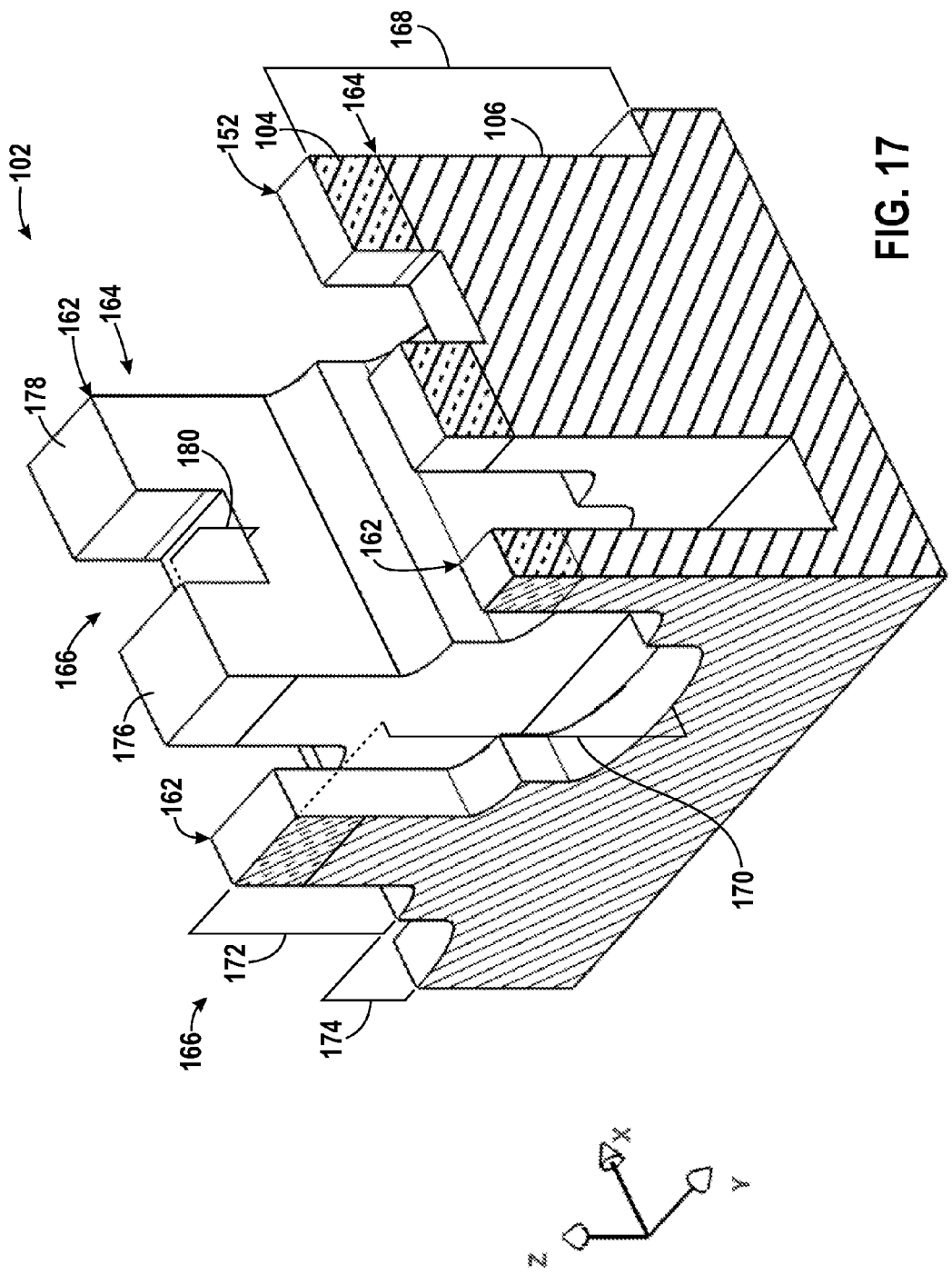

At this stage, the substrate 102 may generally define the dimensions of semiconductor fins 162. To illustrate these dimensions, FIG. 17 depicts the upper doped region 104 and the lower doped region 106 of the substrate 102 with the other features removed. As illustrated, the substrate 102 includes a plurality of semiconductor fins 162. The illustrated fins 162 are arranged in rows 164 generally extending in the X direction, and columns 166 generally extending in the Y direction. In this embodiment, each of the semiconductor fins 162 is isolated both from other semiconductor fins 162 in the same row 164 by a deep trench 168 and from other semiconductor fins 162 in the same column 166 by an intermediate trench 170. The intermediate trenches 170 may include a wider-upper portion 172 and a narrower-lower portion 174. Each of the illustrated semiconductor fins 162 includes a generally U-shaped distal portion with two legs 176 and 178 separated by a shallow trench 180. As explained below, each of these legs 176 and 178 may form either a source or a drain of a transistor.

Figure 18:
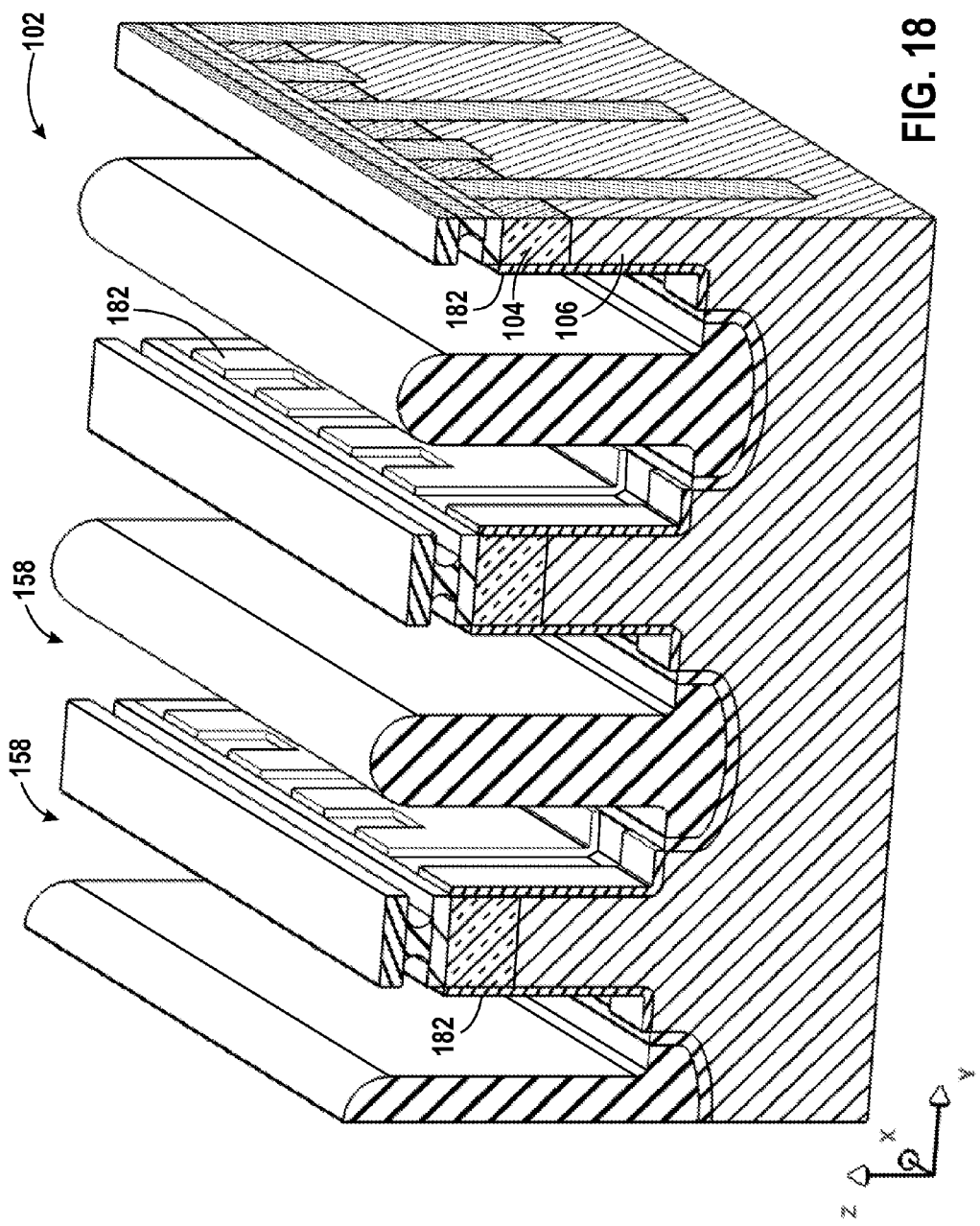

The next step in the presently described embodiment is illustrated by FIG. 18. After forming the gaps 158, a gate dielectric 182 may be formed. In some embodiments, the gate dielectric 182 may be deposited with chemical vapor deposition or atomic layer deposition, or in other embodiments, the gate dielectric 182 may be grown by, for example, exposing the substrate 102 to oxygen in a furnace. The illustrated gate dielectric 182 is grown, and as such, it is generally disposed on the exposed portions of both the upper doped region 104 and the lower doped region 106. The gate dielectric 182 may be made of a variety of dielectric materials, such as oxide, oxynitride, or high-dielectric constant materials like hafnium dioxide, zirconium dioxide, and titanium dioxide.

Figure 19:
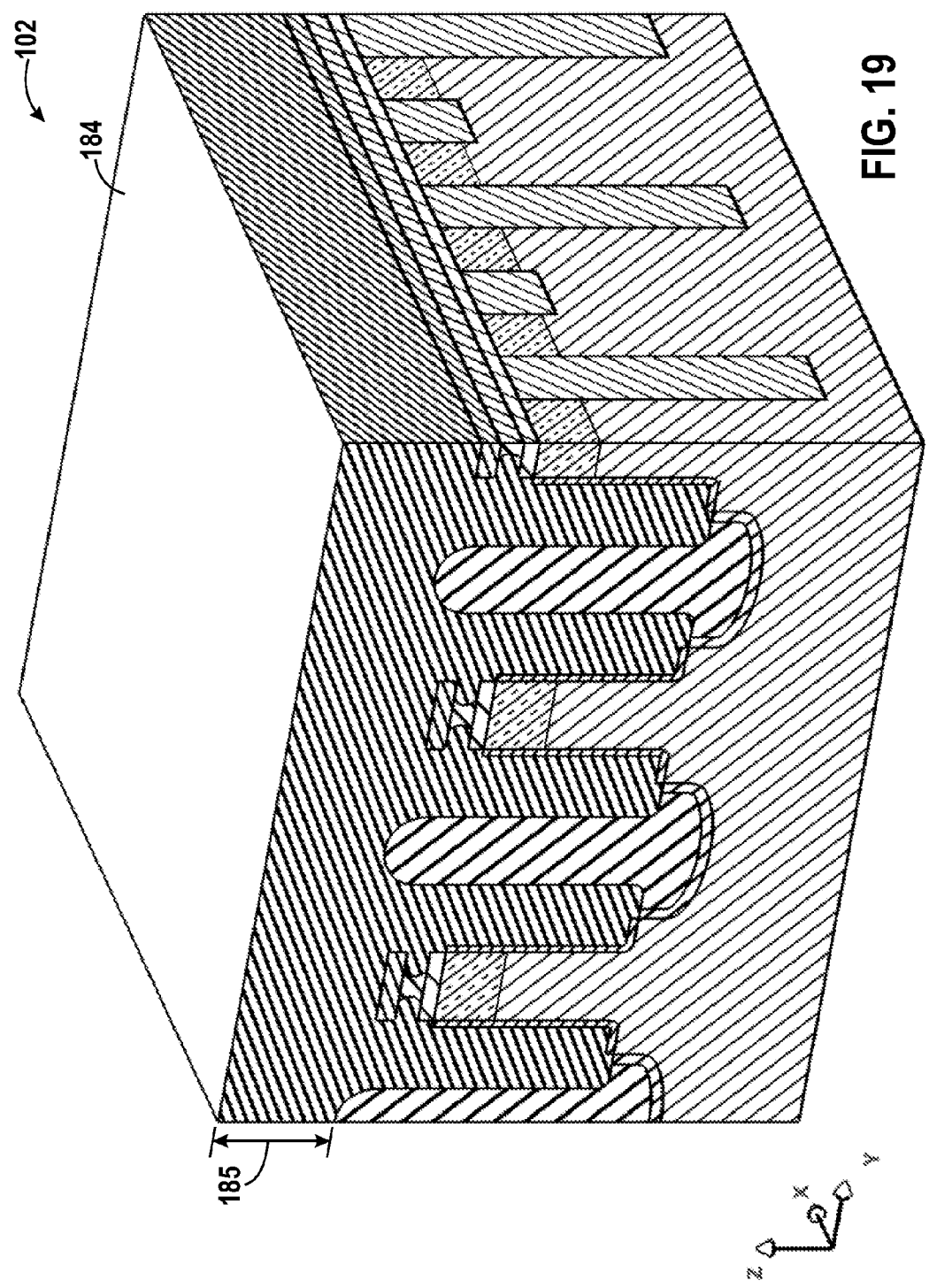

Next, a gate material 184 may be formed on the substrate 102, as depicted by FIG. 19. The illustrated gate material 184 is a conductive material, such as titanium nitride deposited with a sputter process, but in other embodiments, the gate material 184 may include other conductive films, such as doped polysilicon or various metals. In this embodiment, the gate material 184 is deposited with an overburden 185 to planarize the substrate 102 and substantially or entirely fill the furrows 158.

Figure 20:
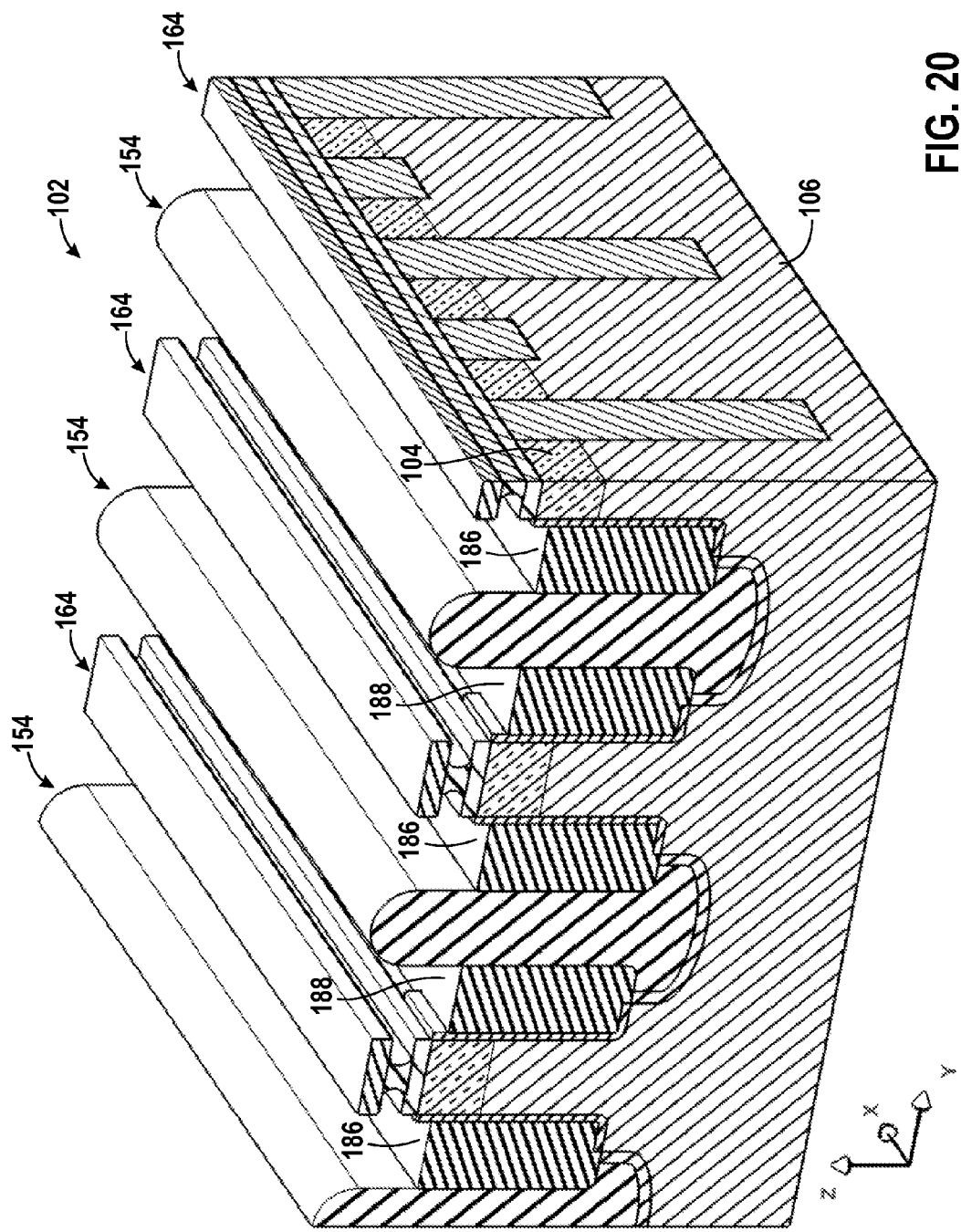

In the illustrated embodiment, the gate material 184 is then etched back to form isolated gates 186 and 188 on either side of the rows 164 of semiconductor fins 162, as illustrated by FIG. 20. The gate material 184 may be recessed below the top of the isolating fins 154, but not so deep that the tops of the gates 186 and 188 are below the bottom of the upper doped region 104. That is, the gates 186 and 188 may at least partially overlap the upper doped region 104.

In some embodiments, the gates 186 in 188 are isolated from one another by the insulating fins 154 even when the sidewalls of the semiconductor fins 162 are sloped. In this embodiment, the gates 186 and 188 are defined in the furrows 158 with an etch back process rather than with a sidewall spacer process. As a result, in some embodiments, sloped fin sidewalls do not necessarily narrow the process window.

Figure 21:
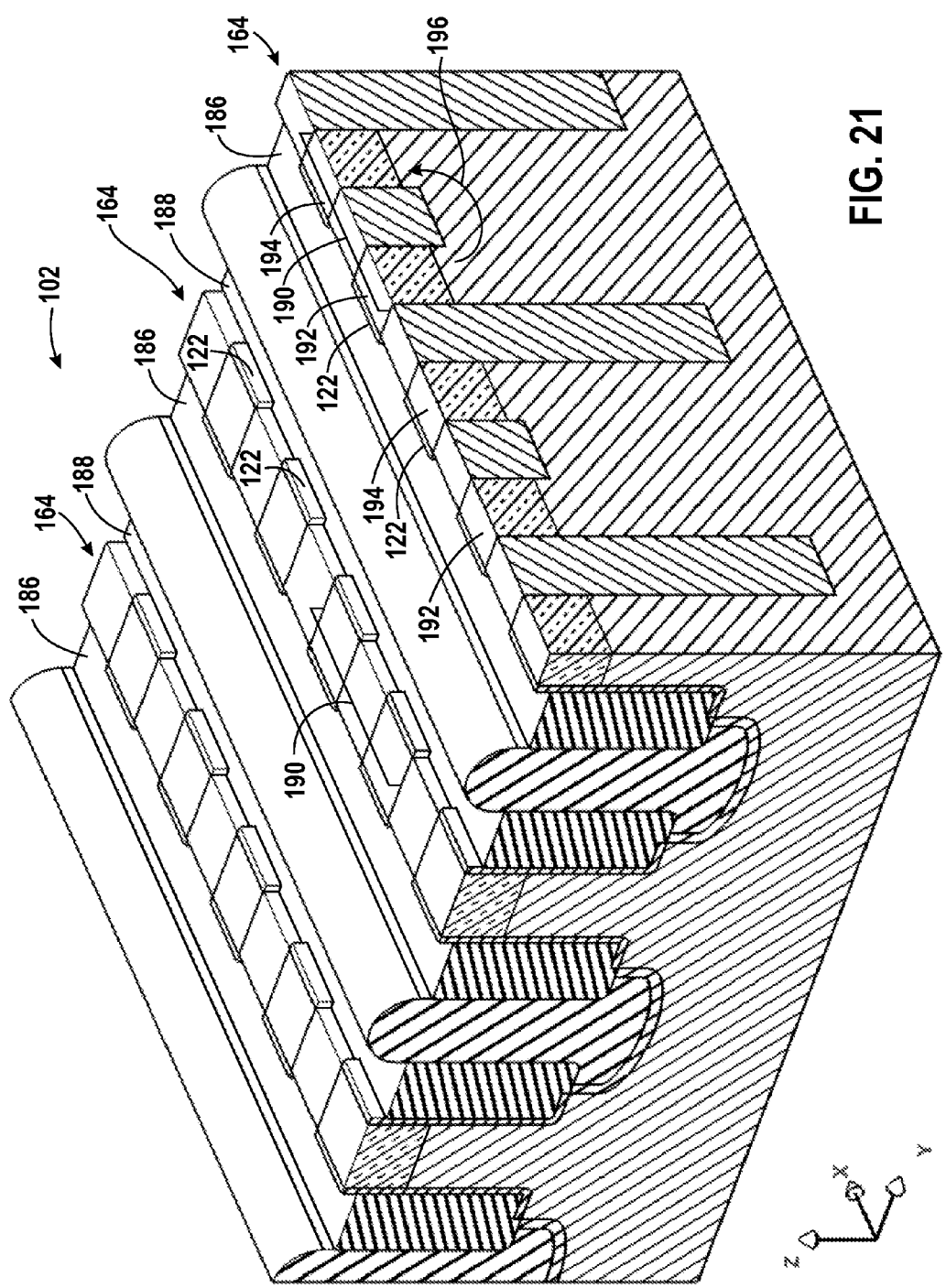
Figure 22:
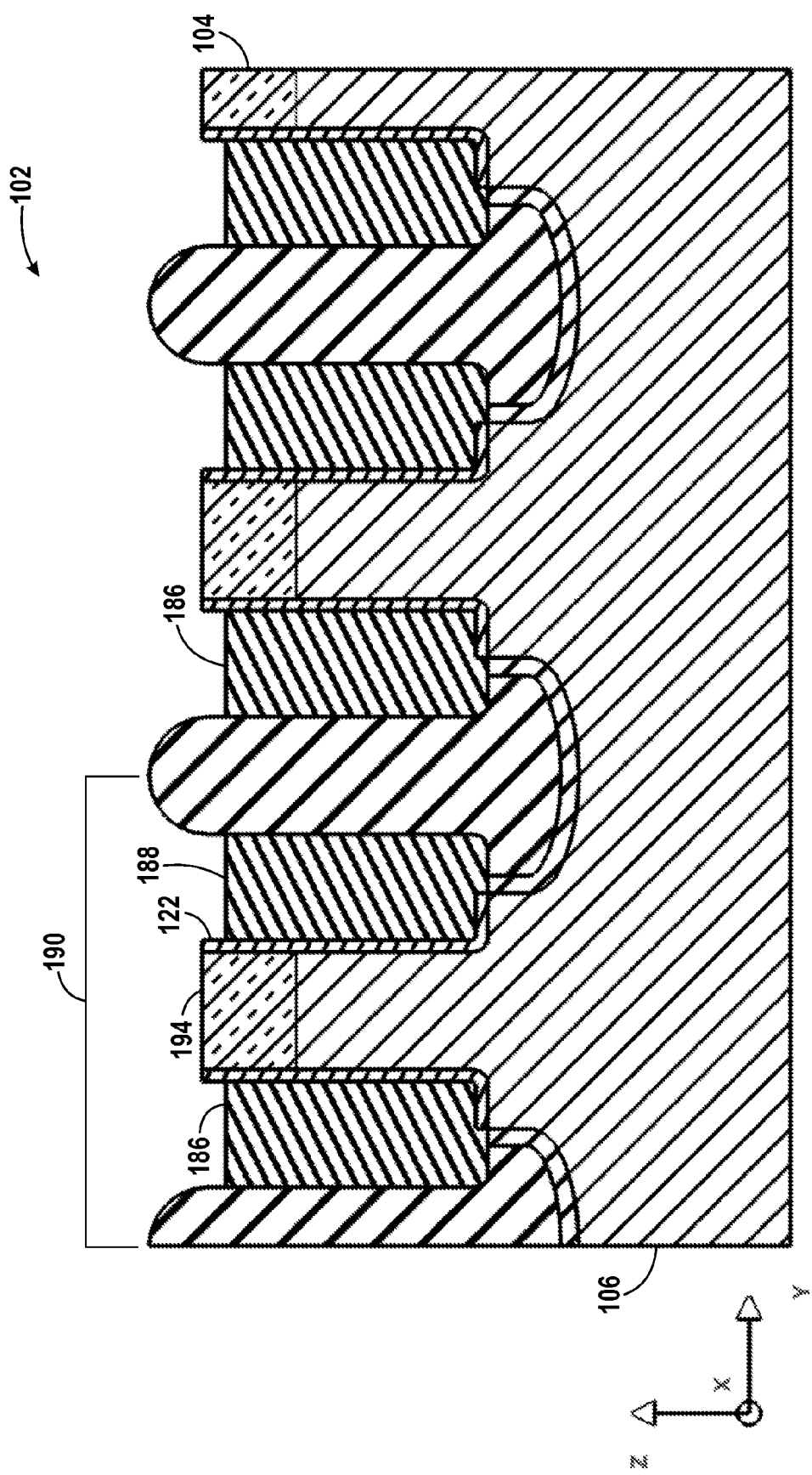

Next, the remainder of the sacrificial masking region 124, the upper stop region 122, and the lower stop region 120 may be removed to expose terminals of the transistors 190, as illustrated by FIGS. 21 and 22. Each of the illustrated transistors 190 includes a source 192, a drain 194, and a channel illustrated by arrow 196, depicting current flow from the source 192 to the drain 194. The transistors 190 may consume an area generally equal to or less than $4 F^2$, including the gates 186 and 188 and isolation associated with each transistor 190.

To turn on the transistors 190, a voltage may be asserted on the gates 186 and 188, and a voltage between the source 192 and drain 194 may drive current 196 through the channel. The illustrated transistors 190 may be referred to as dual-gate transistors or multi-gate transistors, as they have a gate adjacent each side wall. The gates 186 and 188 may be energized according to a variety of patterns: both gates 186 and 188 may be energized generally simultaneously; one gate 186 or 188 may be energized, but not the other; or the gates 186 and 188 may be energized independent of one another. In some embodiments, the gates 186 and 188 may partially or entirely circumscribe the rows 164, e.g., the gates 186 and 188 may connect at one or both ends of the rows 164.

A variety of devices may be connected to the transistors 190. For example, the transistors 190 may connect to other transistors 190 to form a processor, an application specific integrated circuit (ASIC), or static random access memory (SRAM), or the transistors 190 may connect to a device primarily configured to store data, such as a capacitor, phase change memory, ferroelectric memory, or a programmable-metallization cell.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
fin field-effect transistors disposed in rows, wherein each of the fin field-effect transistors comprises a semiconductor fin comprising a generally U-shaped distal portion with two legs comprising a source and a drain of each of the fin field-effect transistors, wherein the two legs define a gap therebetween, wherein the two legs and the gap are aligned such that a drive current generated between the source and the drain flows in a direction parallel to alignment of the rows;
an insulator disposed solely in the gap of the semiconductor fin of each of the fin field-effect transistors; and
insulating fins each disposed in a second gap defined between the fin field-effect transistors disposed in the rows.

2. A device, comprising:
fin field-effect transistors disposed in rows, wherein each of the fin field-effect transistors comprises a semiconductor fin comprising a generally U-shaped distal portion with two legs comprising a source and a drain of each of the fin field-effect transistors, wherein the two legs define a gap therebetween;
an insulator disposed solely in the gap of the semiconductor fin of each of the fin field-effect transistors; and
insulating fins each disposed in a second gap defined between the fin field-effect transistors disposed in the rows, wherein the insulating fins at least partially define furrows in which gates of each of the fin-field effect transistors are disposed.

3. The device of claim 2, wherein at least a portion of the insulating fins is disposed under the gates.

4. The device of claim 2, wherein each row comprises at least two of the fin field-effect transistors.

5. The device of claim 2, wherein the fin field-effect transistors comprise dual-gate fin field-effect transistors.

6. A device, comprising:
a plurality of rows of transistors, each transistor comprising:
a semiconductor fin, comprising a generally U-shaped distal portion with two legs comprising a source and a drain, wherein the two legs define a gap therebetween, wherein the two legs and the gap are aligned such that a drive current generated between the source and the drain flows in a direction parallel to alignment of the rows; and
a gate, at least part of which is disposed adjacent the semiconductor fin;
an insulator disposed solely in the gap of the semiconductor fin of each transistor; and
insulating fins each disposed in a second gap defined between each transistor of a pair of rows of transistors among the plurality of rows of transistors.

7. A device, comprising:
a plurality of rows of transistors, each transistor comprising:
a semiconductor fin, comprising a generally U-shaped distal portion with two legs comprising a source and a drain, wherein the two legs define a gap therebetween; and
a gate, at least part of which is disposed adjacent the semiconductor fin;
an insulator disposed solely in the gap of the semiconductor fin of each transistor; and
insulating fins each disposed in a second gap defined between each transistor of a pair of rows of transistors among the plurality of rows of transistors, wherein the insulating fins are disposed at a height greater than a height of the semiconductor fin.

8. The device of claim 7, wherein each insulating fin among the insulating fins comprises a base, and wherein the base is disposed at least partially under at least one of gates.

9. The device of claim 7, wherein the insulating fins extend along at least a substantial portion of a length of the plurality of rows of transistors.

10. The device of claim 7, wherein each insulating fin among the insulating fins comprises a liner disposed between itself and a substrate.

11. The device of claim 7, wherein each row of transistors among the plurality of rows of transistors comprises a pair of gates disposed on opposite sides of the row of transistors.

12. A device, comprising:
 a first transistor of a first row of transistors and a second transistor of a second row of transistors each of the first and second transistors comprising:
  a semiconductor fin having a width and having a length greater than the width and having a height extending generally perpendicularly from a substrate; and
  a pair of gates formed on either side of the semiconductor fin and extending generally parallel to the semiconductor fin;
 an insulator disposed solely in a gap defined by a source and a drain of the semiconductor fin of each of the first transistor and the second transistor, wherein the source, the drain, and the gap are aligned such that a drive current generated between the source and the drain flows in a direction parallel to alignment of the first row and the second row; and
 an insulating fin disposed in a second gap defined between the first transistor and the second transistor and extending generally parallel to the semiconductor fin of each of the first and second transistors.

13. A device, comprising:
 a first transistor of a first row of transistors and a second transistor of a second row of transistors each of the first and second transistors comprising:
  a semiconductor fin having a width and having a length greater than the width and having a height extending generally perpendicularly from a substrate; and
  a pair of gates formed on either side of the semiconductor fin and extending generally parallel to the semiconductor fin;
 an insulator disposed solely in a gap defined by a source and a drain of the semiconductor fin of each of the first transistor and the second transistor; and
 an insulating fin disposed in a second gap defined between the first transistor and the second transistor and extending generally parallel to the semiconductor fin of each of the first and second transistors, wherein the insulating fin, the semiconductor fin of the first transistor, and the semiconductor fin of the second transistor define a pair of furrows on either side of the insulating fin, wherein a gate among the pair of gates of the first transistor is disposed in a furrow among the pair of furrows and a gate among the pair of gates of the second transistor is disposed in the other furrow among the pair of furrows.

14. The device of claim 13, wherein the semiconductor fin comprises a pair of legs separated by a trench as the source and the drain.

15. The device of claim 13, comprising a liner disposed at least partially under the insulating fin.

16. The device of claim 13, wherein the first transistor and the second transistor each comprises an upper doped region and a lower doped region, wherein the upper doped region is doped different from the lower doped region.

17. A device, comprising:
 a semiconductor fin having a width and having a length greater than the width and having a height extending generally perpendicularly from a substrate, wherein the semiconductor fin comprises a source and a drain of a transistor;
 an insulator disposed solely in a gap defined by the source and the drain of the transistor;
 a gate comprising a first side formed on a first side of the semiconductor fin and extending generally parallel to the semiconductor fin; and
 an insulating fin directly contacting a second side of the gate opposite the first side of the gate, wherein the insulating fin and the second side of the gate extend generally parallel to the semiconductor fin, and
 a liner disposed at least partially under the insulating fin.

18. The device of claim 17, wherein the semiconductor fin comprises a pair of legs separated by a trench.

19. The device of claim 17, wherein the pair of legs comprises the source and the drain of the transistor.

20. The device of claim 17, comprising an upper doped region and a lower doped region of the transistor, wherein the upper doped region is doped different from the lower doped region.

21. The device of claim 17, wherein the insulating fin is disposed at a height greater than the height of the semiconductor fin.

* * * * *